(12) United States Patent
Chang et al.

(10) Patent No.: US 8,951,610 B2
(45) Date of Patent: Feb. 10, 2015

(54) ORGANIC LAYER DEPOSITION APPARATUS

(75) Inventors: Uno Chang, Yongin (KR); Jae-Kwang Ryu, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 151 days.

(21) Appl. No.: 13/467,998

(22) Filed: May 9, 2012

(65) Prior Publication Data

US 2013/0008379 A1   Jan. 10, 2013

(30) Foreign Application Priority Data

Jul. 4, 2011  (KR) ........................ 10-2011-0066125

(51) Int. Cl.
| | | |
|---|---|---|
| *C23C 16/52* | (2006.01) | |
| *C23C 14/12* | (2006.01) | |
| *C23C 14/04* | (2006.01) | |
| *C23C 14/54* | (2006.01) | |
| *H01L 51/00* | (2006.01) | |

(52) U.S. Cl.
CPC ............... *C23C 14/12* (2013.01); *C23C 14/042* (2013.01); *C23C 14/54* (2013.01); *H01L 51/0008* (2013.01)
USPC ........................................ 427/248.1; 118/715

(58) Field of Classification Search
None
See application file for complete search history.

(56) References Cited

U.S. PATENT DOCUMENTS

| | | |
|---|---|---|
| 4,416,217 A | 11/1983 | Nakamura et al. |
| 4,468,648 A | 8/1984 | Uchikune |
| 4,687,939 A | 8/1987 | Miyauchi et al. |
| 4,792,378 A | 12/1988 | Rose et al. |
| 4,901,667 A | 2/1990 | Suzuki et al. |
| 5,454,847 A | 10/1995 | Jacoboni et al. |
| 5,460,654 A | 10/1995 | Kikkawa et al. |
| 5,487,609 A | 1/1996 | Asada |
| 5,742,129 A | 4/1998 | Nagayama et al. |

(Continued)

FOREIGN PATENT DOCUMENTS

| | | |
|---|---|---|
| CN | 1476279 A | 2/2004 |
| CN | 1489419 A | 4/2004 |

(Continued)

OTHER PUBLICATIONS

Machine English Translation of JP 2001-052862, 20 pages.

(Continued)

*Primary Examiner* — Joseph Miller, Jr.
(74) *Attorney, Agent, or Firm* — Christie, Parker & Hale, LLP

(57) ABSTRACT

An organic layer deposition apparatus that may be precisely aligned with a substrate during a deposition process. The apparatus includes: a deposition source; a deposition source nozzle unit; and a patterning slit sheet, which is spaced from and smaller than the substrate, and having a plurality of patterning slits arranged in a second direction perpendicular to the first direction. Deposition is performed while the substrate is moved relative to the deposition apparatus in the first direction. The patterning slit sheet includes first and second alignment marks that are spaced from each other. The substrate includes first and second alignment patterns that are spaced from each other. The deposition apparatus also includes first and second camera assemblies for respectively photographing the first alignment mark/pattern and the second alignment mark/pattern. A moving speed of the substrate is synchronized with shooting speeds of the first and second camera assemblies.

19 Claims, 16 Drawing Sheets

(56) References Cited

U.S. PATENT DOCUMENTS

| | | |
|---|---|---|
| 5,909,995 A | 6/1999 | Wolf et al. |
| 6,045,671 A | 4/2000 | Wu et al. |
| 6,091,195 A | 7/2000 | Forrest et al. |
| 6,099,649 A | 8/2000 | Schmitt et al. |
| 6,274,198 B1 | 8/2001 | Dautartas |
| 6,280,821 B1 | 8/2001 | Kadunce et al. |
| 6,371,451 B1 | 4/2002 | Choi |
| 6,417,034 B2 | 7/2002 | Kitazume et al. |
| 6,443,597 B1 | 9/2002 | Natori |
| 6,483,690 B1 | 11/2002 | Nakajima et al. |
| 6,541,130 B2 | 4/2003 | Fukuda |
| 6,554,969 B1 | 4/2003 | Chong |
| 6,579,422 B1 | 6/2003 | Kakinuma |
| 6,589,673 B1 | 7/2003 | Kido et al. |
| 6,650,023 B2 | 11/2003 | Kim |
| 6,699,324 B1 | 3/2004 | Berdin et al. |
| 6,749,906 B2 | 6/2004 | Van Slyke |
| 6,776,847 B2 | 8/2004 | Yamazaki et al. |
| 6,837,939 B1 | 1/2005 | Klug et al. |
| 6,878,209 B2 | 4/2005 | Himeshima et al. |
| 6,946,783 B2 | 9/2005 | Kim |
| 6,995,035 B2 | 2/2006 | Cok et al. |
| 7,006,202 B2 | 2/2006 | Byun et al. |
| RE39,024 E | 3/2006 | Takahashi |
| 7,078,070 B2 | 7/2006 | Peng |
| 7,199,520 B2 | 4/2007 | Fujii et al. |
| 7,282,855 B2 | 10/2007 | Park et al. |
| 7,322,248 B1 | 1/2008 | Long |
| 7,495,389 B2 | 2/2009 | Noguchi et al. |
| 7,601,439 B2 | 10/2009 | Chun et al. |
| 7,776,457 B2 | 8/2010 | Lee et al. |
| 7,872,256 B2 | 1/2011 | Sung et al. |
| 7,910,386 B2 | 3/2011 | Shiang et al. |
| 7,964,037 B2 | 6/2011 | Fukuda et al. |
| 8,022,448 B1 | 9/2011 | Luu et al. |
| 8,128,753 B2 | 3/2012 | Bulovic et al. |
| 8,137,466 B2 | 3/2012 | Kang et al. |
| 8,188,476 B2 | 5/2012 | Takagi et al. |
| 8,193,011 B2 | 6/2012 | Kang et al. |
| 8,673,077 B2 | 3/2014 | Sonoda et al. |
| 2001/0004186 A1 | 6/2001 | Song et al. |
| 2001/0006827 A1 | 7/2001 | Yamazaki et al. |
| 2001/0019807 A1 | 9/2001 | Yamada et al. |
| 2001/0026638 A1 | 10/2001 | Sangu et al. |
| 2001/0034175 A1 | 10/2001 | Miyazaki et al. |
| 2002/0011785 A1 | 1/2002 | Tang et al. |
| 2002/0017245 A1 | 2/2002 | Tsubaki et al. |
| 2002/0033136 A1 | 3/2002 | Savage et al. |
| 2002/0036759 A1 | 3/2002 | Ise et al. |
| 2002/0050061 A1 | 5/2002 | Komyoji et al. |
| 2002/0076847 A1 | 6/2002 | Yamada et al. |
| 2002/0168577 A1 | 11/2002 | Yoon |
| 2002/0179013 A1 | 12/2002 | Kido et al. |
| 2002/0187253 A1 | 12/2002 | Marcus et al. |
| 2002/0194727 A1 | 12/2002 | Cho et al. |
| 2002/0197393 A1 | 12/2002 | Kuwabara |
| 2003/0021886 A1 | 1/2003 | Baele |
| 2003/0101932 A1 | 6/2003 | Kang |
| 2003/0101937 A1 | 6/2003 | Van Slyke et al. |
| 2003/0117602 A1 | 6/2003 | Kobayashi et al. |
| 2003/0118950 A1 | 6/2003 | Chao et al. |
| 2003/0124764 A1 | 7/2003 | Yamazaki et al. |
| 2003/0151637 A1 | 8/2003 | Nakamura et al. |
| 2003/0164934 A1 | 9/2003 | Nishi et al. |
| 2003/0168013 A1 | 9/2003 | Freeman et al. |
| 2003/0173896 A1 | 9/2003 | Grushin et al. |
| 2003/0221614 A1 | 12/2003 | Kang et al. |
| 2003/0221620 A1 | 12/2003 | Yamazaki |
| 2003/0232563 A1 | 12/2003 | Kamiyama et al. |
| 2004/0016907 A1 | 1/2004 | Shi |
| 2004/0029028 A1 | 2/2004 | Shimizu |
| 2004/0056244 A1 | 3/2004 | Marcus et al. |
| 2004/0086639 A1 | 5/2004 | Grantham et al. |
| 2004/0096771 A1 | 5/2004 | Kashiwagi et al. |
| 2004/0115338 A1 | 6/2004 | Yoneda |
| 2004/0115342 A1 | 6/2004 | Shigemura |
| 2004/0123804 A1 | 7/2004 | Yamazaki et al. |
| 2004/0127066 A1 | 7/2004 | Jung |
| 2004/0134428 A1 | 7/2004 | Sasaki et al. |
| 2004/0142108 A1 | 7/2004 | Atobe et al. |
| 2004/0144321 A1 | 7/2004 | Grace et al. |
| 2004/0157167 A1 | 8/2004 | Morii |
| 2004/0183435 A1 | 9/2004 | Ohshita |
| 2004/0194702 A1 | 10/2004 | Sasaki et al. |
| 2004/0195530 A1 | 10/2004 | Kwak et al. |
| 2004/0216673 A1 | 11/2004 | Sakata et al. |
| 2004/0255857 A1 | 12/2004 | Chow et al. |
| 2004/0263547 A1 | 12/2004 | Sugahara |
| 2004/0263771 A1 | 12/2004 | Jeong et al. |
| 2005/0001546 A1 | 1/2005 | Yamaguchi |
| 2005/0016461 A1 | 1/2005 | Klug et al. |
| 2005/0031836 A1 | 2/2005 | Hirai |
| 2005/0037136 A1 | 2/2005 | Yamamoto |
| 2005/0039684 A1 | 2/2005 | Yi et al. |
| 2005/0072359 A1 | 4/2005 | Kim |
| 2005/0072361 A1 | 4/2005 | Yang et al. |
| 2005/0079418 A1 | 4/2005 | Kelley et al. |
| 2005/0110400 A1 | 5/2005 | Nakamura |
| 2005/0118788 A1 | 6/2005 | Kuwahara et al. |
| 2005/0129489 A1 | 6/2005 | Quan et al. |
| 2005/0153472 A1 | 7/2005 | Yotsuya |
| 2005/0166842 A1 | 8/2005 | Sakamoto |
| 2005/0166844 A1 | 8/2005 | Gralenski |
| 2005/0183670 A1 | 8/2005 | Grantham et al. |
| 2005/0186330 A1 | 8/2005 | Kim et al. |
| 2005/0213021 A1 | 9/2005 | Myoung |
| 2005/0217584 A1 | 10/2005 | Abiko et al. |
| 2005/0229848 A1 | 10/2005 | Shinriki et al. |
| 2005/0244580 A1 | 11/2005 | Cok et al. |
| 2005/0263074 A1 | 12/2005 | Masuda et al. |
| 2006/0011136 A1 | 1/2006 | Yamazaki et al. |
| 2006/0012771 A1 | 1/2006 | Jeong |
| 2006/0022590 A1 | 2/2006 | Aziz et al. |
| 2006/0040132 A1 | 2/2006 | Liao et al. |
| 2006/0045958 A1 | 3/2006 | Abiko et al. |
| 2006/0066231 A1 | 3/2006 | Nishikawa et al. |
| 2006/0090705 A1 | 5/2006 | Kim |
| 2006/0102078 A1 | 5/2006 | Fairbairn et al. |
| 2006/0110544 A1 | 5/2006 | Kim et al. |
| 2006/0113907 A1 | 6/2006 | Im et al. |
| 2006/0115585 A1 | 6/2006 | Bulovic et al. |
| 2006/0130766 A1 | 6/2006 | Kim et al. |
| 2006/0144325 A1 | 7/2006 | Jung et al. |
| 2006/0152641 A1 | 7/2006 | Brody |
| 2006/0164786 A1 | 7/2006 | Kobayashi et al. |
| 2006/0169211 A1 | 8/2006 | Kim et al. |
| 2006/0174829 A1 | 8/2006 | An et al. |
| 2006/0205101 A1 | 9/2006 | Lee et al. |
| 2006/0244696 A1 | 11/2006 | Jung et al. |
| 2006/0267294 A1 | 11/2006 | Busse et al. |
| 2006/0269671 A1 | 11/2006 | Kim et al. |
| 2006/0272572 A1 | 12/2006 | Uematsu et al. |
| 2006/0278522 A1 | 12/2006 | Kim et al. |
| 2006/0278945 A1 | 12/2006 | Sakurai |
| 2006/0280588 A1 | 12/2006 | Blonigan et al. |
| 2007/0009552 A1 | 1/2007 | Whitehead et al. |
| 2007/0009652 A1 | 1/2007 | Manz et al. |
| 2007/0017445 A1 | 1/2007 | Takehara et al. |
| 2007/0022955 A1 | 2/2007 | Bender et al. |
| 2007/0024185 A1 | 2/2007 | Kitamura et al. |
| 2007/0046185 A1 | 3/2007 | Kim |
| 2007/0046913 A1 | 3/2007 | Shibazaki |
| 2007/0054044 A1 | 3/2007 | Shimosaki et al. |
| 2007/0075955 A1 | 4/2007 | Jung et al. |
| 2007/0077358 A1 | 4/2007 | Jeong et al. |
| 2007/0148337 A1 | 6/2007 | Nichols et al. |
| 2007/0148348 A1 | 6/2007 | Huh et al. |
| 2007/0157879 A1 | 7/2007 | Yotsuya |
| 2007/0158471 A1 | 7/2007 | Park et al. |
| 2007/0163497 A1 | 7/2007 | Grace et al. |
| 2007/0178708 A1 | 8/2007 | Ukigaya |
| 2007/0190235 A1 | 8/2007 | Yamazaki et al. |
| 2007/0195844 A1 | 8/2007 | Ma et al. |
| 2007/0231460 A1 | 10/2007 | Ukigaya |

(56) References Cited

U.S. PATENT DOCUMENTS

| | | |
|---|---|---|
| 2007/0275497 A1 | 11/2007 | Kwack et al. |
| 2007/0297887 A1 | 12/2007 | Tanaka |
| 2008/0018236 A1 | 1/2008 | Arai et al. |
| 2008/0038935 A1 | 2/2008 | Baude et al. |
| 2008/0057183 A1 | 3/2008 | Spindler et al. |
| 2008/0100204 A1 | 5/2008 | Kim |
| 2008/0115729 A1 | 5/2008 | Oda et al. |
| 2008/0118743 A1 | 5/2008 | Lee et al. |
| 2008/0129194 A1 | 6/2008 | Abe et al. |
| 2008/0131587 A1 | 6/2008 | Boroson et al. |
| 2008/0145521 A1 | 6/2008 | Guo et al. |
| 2008/0174235 A1 | 7/2008 | Kim et al. |
| 2008/0202421 A1 | 8/2008 | Allen et al. |
| 2008/0216741 A1 | 9/2008 | Ling et al. |
| 2008/0238294 A1 | 10/2008 | Xu et al. |
| 2008/0251785 A1 | 10/2008 | Noh et al. |
| 2008/0286461 A1 | 11/2008 | Noguchi et al. |
| 2008/0290791 A1 | 11/2008 | Lee et al. |
| 2008/0298947 A1 | 12/2008 | Yeo et al. |
| 2008/0309718 A1 | 12/2008 | Oya et al. |
| 2009/0001882 A1 | 1/2009 | Park et al. |
| 2009/0014412 A1 | 1/2009 | Nozawa et al. |
| 2009/0017192 A1 | 1/2009 | Matsuura |
| 2009/0027767 A1 | 1/2009 | Souriau et al. |
| 2009/0124033 A1 | 5/2009 | Moriyama |
| 2009/0133629 A1 | 5/2009 | Kamikawa et al. |
| 2009/0153033 A1 | 6/2009 | Lee et al. |
| 2009/0165713 A1 | 7/2009 | Kim et al. |
| 2009/0169868 A1 | 7/2009 | Haglund, Jr. et al. |
| 2009/0170230 A1 | 7/2009 | Kidu et al. |
| 2009/0181163 A1 | 7/2009 | Uetake |
| 2009/0208754 A1 | 8/2009 | Chu et al. |
| 2009/0220691 A1 | 9/2009 | Kim |
| 2009/0229524 A1 | 9/2009 | Kim et al. |
| 2009/0232976 A1 | 9/2009 | Yoon et al. |
| 2009/0269881 A1 | 10/2009 | Furuta et al. |
| 2009/0277386 A1 | 11/2009 | Takagi et al. |
| 2009/0279173 A1 | 11/2009 | Chui et al. |
| 2009/0302750 A1 | 12/2009 | Jun et al. |
| 2009/0304906 A1 | 12/2009 | Suduo et al. |
| 2009/0304924 A1 | 12/2009 | Gadgil |
| 2009/0308317 A1 | 12/2009 | Sone et al. |
| 2009/0315456 A1 | 12/2009 | Furukawa et al. |
| 2010/0001301 A1 | 1/2010 | Karg et al. |
| 2010/0055810 A1 | 3/2010 | Sung et al. |
| 2010/0086672 A1 | 4/2010 | Von Drasek et al. |
| 2010/0089443 A1 | 4/2010 | Bloomstein et al. |
| 2010/0090594 A1 | 4/2010 | Choi et al. |
| 2010/0130020 A1 | 5/2010 | Kim et al. |
| 2010/0156279 A1 | 6/2010 | Tamura et al. |
| 2010/0165454 A1 | 7/2010 | Suetsugu et al. |
| 2010/0170439 A1 | 7/2010 | Negishi |
| 2010/0192856 A1 | 8/2010 | Sung et al. |
| 2010/0196607 A1 | 8/2010 | Carlson et al. |
| 2010/0248416 A1 | 9/2010 | Priddy et al. |
| 2010/0255198 A1 | 10/2010 | Cleary et al. |
| 2010/0271602 A1 | 10/2010 | Hanazaki |
| 2010/0275842 A1 | 11/2010 | Park et al. |
| 2010/0297348 A1 | 11/2010 | Lee et al. |
| 2010/0297349 A1 | 11/2010 | Lee et al. |
| 2010/0310768 A1 | 12/2010 | Lee et al. |
| 2010/0328197 A1 | 12/2010 | Lee et al. |
| 2010/0330265 A1 | 12/2010 | Lee et al. |
| 2010/0330712 A1 | 12/2010 | Lee et al. |
| 2011/0033619 A1 | 2/2011 | Lee et al. |
| 2011/0033621 A1 | 2/2011 | Lee et al. |
| 2011/0042659 A1 | 2/2011 | Kim et al. |
| 2011/0045617 A1 | 2/2011 | Kang et al. |
| 2011/0048320 A1 | 3/2011 | Choi et al. |
| 2011/0052791 A1 | 3/2011 | Jo et al. |
| 2011/0052795 A1 | 3/2011 | Choi et al. |
| 2011/0053296 A1 | 3/2011 | Lee et al. |
| 2011/0053300 A1 | 3/2011 | Ryu et al. |
| 2011/0068331 A1 | 3/2011 | Koh et al. |
| 2011/0123707 A1 | 5/2011 | Lee et al. |
| 2011/0139069 A1 | 6/2011 | Ahn et al. |
| 2011/0165327 A1 | 7/2011 | Park et al. |
| 2011/0168986 A1 | 7/2011 | Lee et al. |
| 2011/0220019 A1 | 9/2011 | Lee et al. |
| 2011/0220022 A1* | 9/2011 | Hong et al. .......... 118/663 |
| 2011/0241438 A1 | 10/2011 | Kim et al. |
| 2011/0262625 A1 | 10/2011 | Park et al. |
| 2011/0266944 A1 | 11/2011 | Song et al. |
| 2012/0006259 A1 | 1/2012 | Sung et al. |
| 2012/0009328 A1 | 1/2012 | Ryu et al. |
| 2012/0009332 A1 | 1/2012 | Kim et al. |
| 2012/0009706 A1 | 1/2012 | Choi et al. |
| 2012/0028390 A1 | 2/2012 | Lee et al. |
| 2012/0068199 A1 | 3/2012 | Sung et al. |
| 2012/0068201 A1 | 3/2012 | Sung et al. |
| 2012/0070928 A1 | 3/2012 | Kim et al. |
| 2012/0083061 A1 | 4/2012 | Kang et al. |
| 2012/0097992 A1 | 4/2012 | Jeong |
| 2012/0100282 A1 | 4/2012 | Lee et al. |
| 2012/0103253 A1 | 5/2012 | Park et al. |
| 2012/0132137 A1 | 5/2012 | Oh et al. |
| 2012/0145077 A1 | 6/2012 | Chang et al. |
| 2012/0148743 A1 | 6/2012 | Bulovic et al. |
| 2012/0174865 A1 | 7/2012 | Choi et al. |
| 2012/0175605 A1 | 7/2012 | Shin et al. |
| 2012/0183676 A1 | 7/2012 | Sonoda et al. |
| 2012/0214263 A1 | 8/2012 | Yamazaki et al. |
| 2012/0299016 A1 | 11/2012 | Choi |
| 2012/0299023 A1 | 11/2012 | Lee et al. |
| 2012/0299024 A1 | 11/2012 | Lee et al. |
| 2012/0301614 A1 | 11/2012 | Choi et al. |
| 2012/0301986 A1 | 11/2012 | Choi et al. |
| 2012/0313251 A1 | 12/2012 | Kato |
| 2013/0001528 A1 | 1/2013 | Chang et al. |
| 2013/0008379 A1 | 1/2013 | Chang et al. |
| 2013/0032829 A1 | 2/2013 | Sung et al. |
| 2013/0157016 A1 | 6/2013 | Kim |
| 2013/0217164 A1 | 8/2013 | Kang et al. |
| 2013/0291796 A1 | 11/2013 | Inoue et al. |
| 2013/0298829 A1 | 11/2013 | Jo et al. |
| 2013/0341598 A1 | 12/2013 | Chang et al. |
| 2014/0010957 A1 | 1/2014 | Inoue et al. |
| 2014/0014917 A1 | 1/2014 | Lee et al. |
| 2014/0014918 A1 | 1/2014 | Han |
| 2014/0014920 A1 | 1/2014 | Lee |
| 2014/0014921 A1 | 1/2014 | Choi |
| 2014/0014924 A1 | 1/2014 | Oh et al. |
| 2014/0014929 A1 | 1/2014 | Lee et al. |
| 2014/0034917 A1 | 2/2014 | Lee et al. |
| 2014/0045343 A1 | 2/2014 | Choi et al. |
| 2014/0077168 A1 | 3/2014 | Kim |
| 2014/0084262 A1 | 3/2014 | Kim |
| 2014/0084263 A1 | 3/2014 | Jin et al. |
| 2014/0110680 A1 | 4/2014 | Choe |
| 2014/0131667 A1 | 5/2014 | Chang |

FOREIGN PATENT DOCUMENTS

| | | |
|---|---|---|
| CN | 1500904 A | 6/2004 |
| CN | 1556872 A | 12/2004 |
| CN | 1607868 A | 4/2005 |
| CN | 1682569 A | 10/2005 |
| CN | 1704501 A | 12/2005 |
| CN | 1814854 A | 8/2006 |
| CN | 1841696 A | 10/2006 |
| EP | 1 413 644 A2 | 4/2004 |
| EP | 1 418 250 A2 | 5/2004 |
| EP | 1 518 940 A1 | 3/2005 |
| EP | 2354270 A1 | 8/2011 |
| JP | 57-194252 A2 | 11/1982 |
| JP | 2-247372 | 10/1990 |
| JP | 04-272170 | 9/1992 |
| JP | 5-22405 U1 | 3/1993 |
| JP | 5-98425 A2 | 4/1993 |
| JP | 5-230628 A2 | 9/1993 |
| JP | 08-027568 | 1/1996 |
| JP | 9-95776 A2 | 4/1997 |
| JP | 10-50478 | 2/1998 |
| JP | 10-120171 | 5/1998 |

(56) References Cited

FOREIGN PATENT DOCUMENTS

| | | |
|---|---|---|
| JP | 10-270535 | 10/1998 |
| JP | 11-144865 | 5/1999 |
| JP | 2000-068054 A | 3/2000 |
| JP | 2000-282219 | 10/2000 |
| JP | 2000-323277 | 11/2000 |
| JP | 2001-28325 A2 | 1/2001 |
| JP | 2001-052862 A | 2/2001 |
| JP | 2001-093667 A | 4/2001 |
| JP | 2002-75638 A2 | 3/2002 |
| JP | 2002-175878 A | 6/2002 |
| JP | 2002-348659 A2 | 12/2002 |
| JP | 2003-003250 A | 1/2003 |
| JP | 2003-077662 A | 3/2003 |
| JP | 2003-157973 A | 5/2003 |
| JP | 2003-197531 A2 | 7/2003 |
| JP | 2003-297562 A | 10/2003 |
| JP | 2003-321767 A2 | 11/2003 |
| JP | 2003-347394 A2 | 12/2003 |
| JP | 2004-035964 A2 | 2/2004 |
| JP | 2004-043898 A | 2/2004 |
| JP | 2004-76150 A2 | 3/2004 |
| JP | 2004-91858 A2 | 3/2004 |
| JP | 2004-103269 A | 4/2004 |
| JP | 2004-103341 A | 4/2004 |
| JP | 2004-107764 A2 | 4/2004 |
| JP | 2004-137583 A2 | 5/2004 |
| JP | 2004-143521 A2 | 5/2004 |
| JP | 2004-169169 A2 | 6/2004 |
| JP | 2004-199919 A | 7/2004 |
| JP | 2004-225058 | 8/2004 |
| JP | 2004-342455 A2 | 12/2004 |
| JP | 2004-349101 | 12/2004 |
| JP | 2004-355975 | 12/2004 |
| JP | 2005-044592 A | 2/2005 |
| JP | 2005-101505 | 4/2005 |
| JP | 2005-122980 A2 | 5/2005 |
| JP | 2005-163099 | 6/2005 |
| JP | 2005-165015 A2 | 6/2005 |
| JP | 2005-174843 A2 | 6/2005 |
| JP | 2005-206939 A | 8/2005 |
| JP | 2005-213616 A2 | 8/2005 |
| JP | 2005-235568 A | 9/2005 |
| JP | 2005-293968 A | 10/2005 |
| JP | 2005-296737 A | 10/2005 |
| JP | 3705237 | 10/2005 |
| JP | 2006-028583 A | 2/2006 |
| JP | 2006-172930 A | 6/2006 |
| JP | 2006-176809 A | 7/2006 |
| JP | 2006-210038 A2 | 8/2006 |
| JP | 2006-219760 | 8/2006 |
| JP | 2006-275433 A | 10/2006 |
| JP | 2006-292955 A | 10/2006 |
| JP | 2006-307247 A2 | 11/2006 |
| JP | 2007-047293 A | 2/2007 |
| JP | 2007-66862 | 3/2007 |
| JP | 2007-146219 | 6/2007 |
| JP | 2007-157886 | 6/2007 |
| JP | 2007-186740 A2 | 7/2007 |
| JP | 2007-242436 | 9/2007 |
| JP | 2007-291506 A2 | 11/2007 |
| JP | 2008-19477 A2 | 1/2008 |
| JP | 2008-108628 A2 | 5/2008 |
| JP | 2008-121098 A | 5/2008 |
| JP | 2008-521165 A2 | 6/2008 |
| JP | 2008-156686 | 7/2008 |
| JP | 2008-196003 | 8/2008 |
| JP | 2008-248301 A2 | 10/2008 |
| JP | 2008-274373 | 11/2008 |
| JP | 2008-300056 | 12/2008 |
| JP | 2009-019243 A | 1/2009 |
| JP | 2009-024208 A | 2/2009 |
| JP | 2009-049223 | 3/2009 |
| JP | 2009-081165 A | 4/2009 |
| JP | 2009-087910 A | 4/2009 |
| JP | 2009-117231 A2 | 5/2009 |
| JP | 2010-159167 A2 | 7/2010 |
| JP | 2010-261081 A | 11/2010 |
| JP | 2011-47035 | 3/2011 |
| JP | WO 2011/034011 | 3/2011 |
| JP | 2011-146377 | 7/2011 |
| JP | 2012-92448 | 5/2012 |
| JP | 2012-211352 | 11/2012 |
| KR | 1997-0008709 A | 2/1997 |
| KR | 10-0257219 B1 | 2/2000 |
| KR | 10-2000-0019254 A | 4/2000 |
| KR | 10-2000-0023929 A | 5/2000 |
| KR | 10-1997005430 | 5/2000 |
| KR | 2001-0024652 A | 3/2001 |
| KR | 2001-0030175 A | 4/2001 |
| KR | 10-2001-0039298 A | 5/2001 |
| KR | 10-2001-0059939 A | 7/2001 |
| KR | 10-2001-0092914 A | 10/2001 |
| KR | 10-2001-0093666 | 10/2001 |
| KR | 20-0257218 Y1 | 12/2001 |
| KR | 10-2002-0000201 A | 1/2002 |
| KR | 2002-0001555 A | 1/2002 |
| KR | 2002-0025760 | 4/2002 |
| KR | 10-2002-0050922 A | 6/2002 |
| KR | 10-2002-0090934 A | 12/2002 |
| KR | 10-2002-0091457 A | 12/2002 |
| KR | 2003-0001745 A | 1/2003 |
| KR | 10-2003-0034730 A | 5/2003 |
| KR | 10-2003-0043012 A | 6/2003 |
| KR | 2003-0046090 A | 6/2003 |
| KR | 2003-0069684 A | 8/2003 |
| KR | 10-0405080 | 11/2003 |
| KR | 10-0406059 B1 | 11/2003 |
| KR | 10-2003-0091947 A | 12/2003 |
| KR | 10-2003-0093959 A | 12/2003 |
| KR | 2003-0094033 A | 12/2003 |
| KR | 10-2004-0014258 | 2/2004 |
| KR | 20-0342433 Y1 | 2/2004 |
| KR | 10-2004-0034537 | 4/2004 |
| KR | 10-2004-0039910 A | 5/2004 |
| KR | 10-0430336 B1 | 5/2004 |
| KR | 2004-0050045 A | 6/2004 |
| KR | 2004-0069281 A | 8/2004 |
| KR | 10-2004-0084747 A | 10/2004 |
| KR | 10-2004-0087142 | 10/2004 |
| KR | 10-2004-0110718 A | 12/2004 |
| KR | 10-0463212 | 12/2004 |
| KR | 10-2005-0018234 A | 2/2005 |
| KR | 10-2005-0024324 A | 3/2005 |
| KR | 10-2005-0028943 | 3/2005 |
| KR | 10-2005-0039140 A | 4/2005 |
| KR | 10-0483487 B1 | 4/2005 |
| KR | 10-2005-0062853 A | 6/2005 |
| KR | 10-2005-0082644 A | 8/2005 |
| KR | 10-0520159 | 10/2005 |
| KR | 10-0532657 B1 | 12/2005 |
| KR | 10-2006-0008602 A | 1/2006 |
| KR | 10-2006-0018745 A | 3/2006 |
| KR | 10-2006-0020050 A | 3/2006 |
| KR | 10-2006-0045225 A | 5/2006 |
| KR | 10-2006-0049050 A | 5/2006 |
| KR | 10-2006-0051746 A | 5/2006 |
| KR | 10-2006-0053926 A | 5/2006 |
| KR | 10-2006-0056706 A | 5/2006 |
| KR | 10-2006-0058459 A | 5/2006 |
| KR | 10-2006-0059068 A | 6/2006 |
| KR | 10-2006-0059323 A | 6/2006 |
| KR | 10-2006-0060994 | 6/2006 |
| KR | 10-2006-0065978 A | 6/2006 |
| KR | 10-2006-0073367 A | 6/2006 |
| KR | 10-2006-0077887 A | 7/2006 |
| KR | 10-2006-0080475 A | 7/2006 |
| KR | 10-2006-0080481 A | 7/2006 |
| KR | 10-2006-0080482 A | 7/2006 |
| KR | 10-2006-0081943 A | 7/2006 |
| KR | 10-2006-0083510 A | 7/2006 |
| KR | 10-2006-0092387 A | 8/2006 |
| KR | 10-2006-0098755 A | 9/2006 |
| KR | 10-2006-0104288 A | 10/2006 |
| KR | 10-2006-0104675 A | 10/2006 |

(56) References Cited

FOREIGN PATENT DOCUMENTS

| | | |
|---|---|---|
| KR | 10-2006-0104677 A | 10/2006 |
| KR | 10-2006-0109561 A | 10/2006 |
| KR | 10-2006-0109627 A | 10/2006 |
| KR | 10-0635903 B1 | 10/2006 |
| KR | 10-2006-0114462 A | 11/2006 |
| KR | 10-2006-0114477 A | 11/2006 |
| KR | 10-2006-0114573 A | 11/2006 |
| KR | 10-0645719 B1 | 11/2006 |
| KR | 10-0646160 | 11/2006 |
| KR | 10-2006-0123944 A | 12/2006 |
| KR | 10-0687007 | 2/2007 |
| KR | 10-2007-0025164 A | 3/2007 |
| KR | 10-0696547 B1 | 3/2007 |
| KR | 10-0696550 B1 | 3/2007 |
| KR | 10-0697663 B1 | 3/2007 |
| KR | 10-0698033 | 3/2007 |
| KR | 10-0700466 | 3/2007 |
| KR | 10-2007-0035796 A | 4/2007 |
| KR | 10-2007-0037848 A | 4/2007 |
| KR | 10-0711885 | 4/2007 |
| KR | 10-2007-0050793 A | 5/2007 |
| KR | 10-0723627 B1 | 5/2007 |
| KR | 10-2007-0056190 A | 6/2007 |
| KR | 10-0726132 | 6/2007 |
| KR | 10-0736218 B1 | 7/2007 |
| KR | 10-0739309 B1 | 7/2007 |
| KR | 10-0741142 B1 | 7/2007 |
| KR | 10-2007-0078713 A | 8/2007 |
| KR | 10-2007-0080635 A | 8/2007 |
| KR | 10-2007-0091437 A | 9/2007 |
| KR | 10-2006-0028115 | 10/2007 |
| KR | 10-2007-0097218 | 10/2007 |
| KR | 10-2007-0098122 A | 10/2007 |
| KR | 10-2007-0101842 A | 10/2007 |
| KR | 10-2007-0105595 A | 10/2007 |
| KR | 10-0768212 B1 | 10/2007 |
| KR | 10-0770653 B1 | 10/2007 |
| KR | 10-2007-0112668 A | 11/2007 |
| KR | 10-2007-0114094 A | 11/2007 |
| KR | 10-0787457 B1 | 12/2007 |
| KR | 10-2008-0001184 A | 1/2008 |
| KR | 10-2008-0003720 | 1/2008 |
| KR | 10-2008-0007896 A | 1/2008 |
| KR | 10-2008-0009285 A | 1/2008 |
| KR | 10-0797787 | 1/2008 |
| KR | 10-0800125 | 1/2008 |
| KR | 10-0815265 | 3/2008 |
| KR | 10-2008-036983 A | 4/2008 |
| KR | 10-0823508 B1 | 4/2008 |
| KR | 10-0823511 B1 | 4/2008 |
| KR | 10-2008-0044239 A | 5/2008 |
| KR | 10-2008-0044775 | 5/2008 |
| KR | 10-2008-0046761 A | 5/2008 |
| KR | 10-0827760 | 5/2008 |
| KR | 10-2008-0048653 | 6/2008 |
| KR | 10-2008-0055124 A | 6/2008 |
| KR | 10-2008-0057159 A | 6/2008 |
| KR | 10-0839380 | 6/2008 |
| KR | 10-2008-0060400 A | 7/2008 |
| KR | 10-2008-0061132 A | 7/2008 |
| KR | 10-2008-0061666 A | 7/2008 |
| KR | 10-2008-0061774 A | 7/2008 |
| KR | 10-2008-0062212 A | 7/2008 |
| KR | 10-2008-0076574 A | 8/2008 |
| KR | 10-2008-0088737 A | 10/2008 |
| KR | 10-2008-0104479 A | 12/2008 |
| KR | 10-2008-0104695 A | 12/2008 |
| KR | 10-2008-0109559 A | 12/2008 |
| KR | 10-2009-0017910 A | 2/2009 |
| KR | 10-0889872 B1 | 3/2009 |
| KR | 10-2009-0038733 A | 4/2009 |
| KR | 10-2009-0040618 A | 4/2009 |
| KR | 10-2009-0047953 A | 5/2009 |
| KR | 10-2009-0052155 A | 5/2009 |
| KR | 10-2009-0052828 A | 5/2009 |
| KR | 10-2009-0053417 A | 5/2009 |
| KR | 10-0899279 B1 | 5/2009 |
| KR | 10-2009-0066996 A | 6/2009 |
| KR | 10-2009-0075887 A | 7/2009 |
| KR | 10-2009-0079765 A | 7/2009 |
| KR | 10-2009-0081717 A | 7/2009 |
| KR | 10-0908232 B1 | 7/2009 |
| KR | 10-2009-0093161 A | 9/2009 |
| KR | 10-2009-0094911 A | 9/2009 |
| KR | 10-2009-0097453 | 9/2009 |
| KR | 10-2009-0107702 | 10/2009 |
| KR | 10-0922763 A | 10/2009 |
| KR | 10-2010-0000128 A | 1/2010 |
| KR | 10-2010-0000129 A | 1/2010 |
| KR | 10-2010-0002381 A | 1/2010 |
| KR | 10-2010-0026655 A | 3/2010 |
| KR | 10-2010-0038088 A | 4/2010 |
| KR | 10-2010-0044606 A | 4/2010 |
| KR | 10-2010-0047796 | 5/2010 |
| KR | 10-0961110 B1 | 6/2010 |
| KR | 10-2010-0090070 A | 8/2010 |
| KR | 10-2010-0099806 A | 9/2010 |
| KR | 10-2010-0119368 A | 11/2010 |
| KR | 10-2010-0126125 A | 12/2010 |
| KR | 10-2010-0128589 A | 12/2010 |
| KR | 10-2010-0130786 A | 12/2010 |
| KR | 10-2010-0133678 A | 12/2010 |
| KR | 10-2010-0138139 A | 12/2010 |
| KR | 10-1017654 B1 | 2/2011 |
| KR | 10-2011-0021090 A | 3/2011 |
| KR | 10-2011-0022512 A | 3/2011 |
| KR | 10-2011-0032589 A | 3/2011 |
| KR | 10-2011-0082418 A | 7/2011 |
| KR | 10-2011-0101767 A | 9/2011 |
| KR | 10-2011-0110525 A | 10/2011 |
| KR | 10-2011-0120213 A | 11/2011 |
| KR | 10-2011-0138787 A | 12/2011 |
| KR | 10-2012-0006322 A | 1/2012 |
| KR | 10-2012-0006324 A | 1/2012 |
| KR | 10-2012-0012300 | 2/2012 |
| KR | 10-2012-0042155 A | 5/2012 |
| KR | 10-2012-0065789 A | 6/2012 |
| KR | 10-2012-0080855 A | 7/2012 |
| KR | 10-2012-0081811 A | 7/2012 |
| KR | 10-1193186 B1 | 10/2012 |
| KR | 10-2012-0131545 A | 12/2012 |
| KR | 10-2013-0007308 A | 1/2013 |
| WO | 9925894 A1 | 5/1999 |
| WO | 03043067 A1 | 5/2003 |
| WO | WO2004016406 A1 | 2/2004 |
| WO | 2008004792 A1 | 1/2008 |

OTHER PUBLICATIONS

Machine English Translation of JP 2003-003250, 25 pages.
Machine English Translation of JP 2009-024208, 30 pages.
Korean Office action dated Aug. 1, 2011 for corresponding Korean Patent No. 10-2009-0074001, 3 pages.
Korean Office action dated Feb. 1, 2012 for corresponding Korean Patent No. 10-2010-0014272, 4 pages.
Korean Office action dated Feb. 6, 2012 for corresponding Korean Patent No. 10-2010-0021835, 4 pages.
Korean Patent Abstracts, Publication No. 10-2002-0086047 A, dated Nov. 18, 2002, for corresponding Korean Patent No. 10-0405080, 2 pages.
Korean Patent Abstracts, Publication No. 10-2002-0088662 A, dated Nov. 29, 2002, for corresponding Korean Patent No. 10-0463212, 2 pages.
Korean Patent Abstracts, Publication No. 10-2005-0045619 A, dated May 17, 2005, for corresponding Korean Patent No. 10-0520159, 2 pages.
Korean Patent Abstracts, Publication No. 10-2004-0062203 A, dated Jul. 7, 2004, for corresponding Korean Patent No. 10-0646160, 2 pages.
Korean Patent Abstracts, Publication No. 10-2006-0101987 A, dated Sep. 27, 2006, for corresponding Korean Patent No. 10-0687007, 2 pages.

(56) References Cited

OTHER PUBLICATIONS

Korean Patent Abstracts, Publication No. 10-2002-0056238 A, dated Jul. 10, 2001, for corresponding Korean Patent No. 10-0698033, 2 pages.
Korean Patent Abstracts, Publication No. 10-2005-0078637 A, dated Aug. 5, 2005, for corresponding Korean Patent No. 10-0700466, 2 pages.
Korean Patent Abstracts, Publication No. 10-2007-0025164 A, dated Mar. 8, 2007, for corresponding Korean Patent No. 10-0711885, 2 pages.
Korean Patent Abstracts, Publication No. 10-2002-0034272 A, dated May 9, 2002, for corresponding Korean Patent No. 10-0726132, 2 pages.
Korean Patent Abstracts, Publication No. 10-2006-0126267 A, dated Dec. 7, 2006, for corresponding Korean Patent No. 10-0797787, 2 pages.
English Abstract, Publication No. 10-2008-0002189 A, dated Jan. 4, 2008, for corresponding Korean Patent No. 10-0800125, 1 page.
Korean Patent Abstracts, Publication No. 10-2007-0050793 A, dated May 16, 2007, for corresponding Korean Patent No. 10-0815265, 2 pages.
Korean Patent Abstracts, Publication No. 10-2001-0062735 A, dated Jul. 7, 2001, for corresponding Korean Patent No. 10-0827760, 2 pages.
Korean Patent Abstracts, Publication No. 10-2008-0038650 A, dated May 7, 2008, for corresponding Korean Patent No. 10-0839380, 2 pages.
Korean Patent Abstracts, Publication No. 10-2008-0022592 A, dated Mar. 11, 2008, for corresponding Korean Patent No. 10-2009-0097453, 2 pages.
KIPO Registration Determination Certificate dated Aug. 24, 2012, for Korean Patent application 10-2010-0066993, (5 pages).
KIPO Office action dated Apr. 2, 2012, for Korean Patent application 10-2010-0066993, (4 pages).
JPO Office action dated Jul. 22, 2014, for corresponding Japanese Patent application 2011-054148, (2 pages).
European Search Report dated May 13, 2011 for European Application No. 11250019.4 (6 pages).
European Search Report dated May 20, 2011 for European Application No. 10251404.9 (12 pages).
European Search Report dated May 27, 2011 for European Application No. 10251514.5 (11 pages).
European Search Report dated Sep. 6, 2010 for European Application No. 10250962.7 (5 pages).
Japanese Patent Office Action dated Jan. 22, 2013 for Japanese Application No. 2010-116470, (3 pages).
Japanese Patent Office Action dated Jan. 8, 2013 for Japanese Application No. 2011-000180 (3 pages).
Japanese Patent Office Action dated Mar. 19, 2013 for Japanese Application No. 2011-097909, (3 pages).
JP Office action dated Aug. 21, 2012, issued to JP Application No. 2010-145075 (5 pages).
JP Office action dated Sep. 4, 2012, issued to JP Application No. 2010-152846 (4 pages).
JPO Office action dated Apr. 1, 2014, for Japanese Patent application 2010-286245 (4 pages).
JPO Office action dated Feb. 25, 2014, for corresponding Japanese Patent application 2013-128405 (3 pages).
JPO Office action dated Jan. 28, 2014, for corresponding Japanese Patent application 2011-097909 (4 pages).
KIPO Notice of Allowance dated Apr. 26, 2012 for Korean Application No. 10-2010-0066991 (5 pages).
KIPO Notice of Allowance dated Apr. 30, 2012, issued to KR 10-2010-0066992 (5 pages).
KIPO Notice of Allowance dated Jul. 20, 2012, issued to KR 10-2010-0003545 (5 pages).
KIPO Notice of Allowance dated Oct. 27, 2011 for Korean Application No. 10-2010-0002381 (5 pages).
KIPO Notice of Allowance dated Oct. 31, 2011 for Korean Patent application 10-2010-0014273, ( 5 pages).
KIPO Notice of Allowance dated Sep. 1, 2012, for Korean Patent application 10-2010-0013847 (5 pages).
KIPO Notice of Allowance dated Sep. 1, 2012, issued to KR 10-2010-0009160 (5 pages).
KIPO Notice of Allowance dated Sep. 1, 2012, issued to KR 10-2010-0013848 (5 pages).
KIPO Notice of Allowance dated Sep. 23, 2011 for Korean Application No. 10-2009-0055473 (5 pages).
KIPO Notice of Allowance dated Sep. 28, 2011 for Korean Application No. 10-2009-0045201 (5 pages).
KIPO Notice of Allowance dated Sep. 28, 2011 for Korean Application No. 10-2009-0052359 (5 pages).
KIPO Notice of Allowance, dated Nov. 25, 2011, issued to KR 10-2010-0014277 (5 pages).
KIPO Notice of Allowance, dated Sep. 1, 2012, issued to KR 10-2010-0014276 (5 pages).
KIPO Notice of Allowance, dated Sep. 28, 2011, issued to KR 10-2009-0052357 (5 pages).
KIPO Office action dated Apr. 4, 2012, issued in KR Application No. 10-2009-0112796 (5 Pages).
KIPO Office Action dated Apr. 9, 2012 for Korean Application No. 10-2010-0031556 (4 pages).
KIPO Office Action dated Aug. 28, 2012, issued to KR 10-2010-0014274 (5 pages).
KIPO Office action dated Feb. 1, 2012, for Korean Patent application 10-2010-0013847 (5 pages).
KIPO Office action dated Feb. 1, 2012, issued to KR 10-2010-0011196 (4 pages).
KIPO Office action dated Feb. 1, 2012, issued to KR 10-2010-0013848 (4 pages).
KIPO Office Action dated Feb. 6, 2012 for Korean Application No. 10-2010-0011480 (8 pages).
KIPO Office Action dated Feb. 6, 2012 for Korean Application No. 10-2010-0011481 (7 pages).
KIPO Office Action dated Feb. 6, 2012, issued to KR 10-2010-0014274 (9 pages).
KIPO Office action dated Jan. 13, 2012, issued to KR 10-2009-0056529 (5 pages).
KIPO Office action dated Jan. 6, 2012, issued to KR Application No. 10-2010-0000897 (4 pages).
KIPO Office action dated Jul. 1, 2011, issued to KR Application No. 10-2009-0072111 (4 Pages).
KIPO Office action dated Jun. 1, 2011, issued to KR Application No. 10-2009-0050528 (4 pages).
KIPO Office action dated Mar. 21, 2012, issued to KR Application No. 10-2010-0065465 (5 pages).
KIPO Office action dated Sep. 1, 2012, issued to KR 10-2010-0010136 (5 pages).
KIPO Registration Determination Certificate dated Jul. 2, 2012, for Korean Application No. 10-2010-0011480 (5 pages).
KIPO Registration Determination Certificate dated Jul. 2, 2012, for Korean Application No. 10-2010-0011481 (5 pages).
KIPO Registration Determination Certificate dated Nov. 30, 2011, for Korean application 10-2009-0056530 (5 pages).
KIPO Registration Determination Certificate, dated Jul. 20, 2012, issued to KR Application No. 10-2010-0000897 (5 pages).
Korean Registration Certificate dated Sep. 28, 2011 for Korean Application No. 10-2009-0045200 (5 pages).
SIPO Certificate of Patent dated Aug. 14, 2013, for Chinese application 201010266406.6, (36 pages).
SIPO Certificate of Patent dated Jul. 31, 2013, corresponding to Chinese Patent application 201110029291.3, (31 pages).
SIPO Office action dated Dec. 17, 2013, for Chinese Patent application 201010216896.9 (6 pages).
SIPO Office action dated Feb. 14, 2014, for corresponding Chinese Patent application 201010189614.0 (16 pages).
SIPO Office action dated Mar. 11, 2014, for corresponding Chinese Patent application 201010189581.X (9 pages).
SIPO Office Action dated May 29, 2013, for Chinese Application No. 201010189614.0 (12 pages).
SIPO Office Action dated Nov. 28, 2012 for Chinese Application No. 201110029291.3 (11 pages).

(56) References Cited

OTHER PUBLICATIONS

SIPO Office Action dated Oct. 9, 2012 for Chinese Application No. 201010266406.6 (6 pages).
Taiwanese Office action dated Apr. 14, 2014, for Taiwanese Patent application 100114360 (20 pages).
Taiwanese Office action dated Dec. 20, 2013, for Taiwanese Patent application 099116077 (8 pages).
U.S. Interview Summary dated Mar. 11, 2014 for U.S. Appl. No. 12/813,786 (4 pages).
U.S. Notice of Allowance dated Feb. 20, 2014, issued to U.S. Appl. No. 12/907,396 (13 pages).
U.S. Notice of Allowance dated Feb. 28, 2014, issued to U.S. Appl. No. 13/279,077 (12 pages).
U.S. Notice of Allowance dated Jun. 11, 2014, issued to U.S. Appl. No. 13/468,835 (62 pages).
U.S. Notice of Allowance dated Jun. 30, 2014, issued to U.S. Appl. No. 12/907,396 (40 pages).
U.S. Notice of Allowance dated May 9, 2014 for U.S. Appl. No. 13/194,759 (27 pages).
U.S. Office action dated Apr. 1, 2013, issued to U.S. Appl. No. 12/784,774 (44 pages).
U.S. Office action dated Apr. 18, 2014, issued to U.S. Appl. No. 12/814,816 (9 pages).
U.S. Office action dated Apr. 29, 2013, issued to U.S. Appl. No. 12/820,355 (31 pages).
U.S. Office action dated Aug. 13, 2013, issued to U.S. Appl. No. 13/194,759 (28 pages).
U.S. Office Action dated Aug. 2, 2013 for U.S. Appl. No. 12/868,099 (32 pages).
U.S. Office action dated Aug. 21, 2013 issued in cross-reference U.S. Appl. No. 12/820,355 (14 pages).
U.S. Office action dated Aug. 7, 2013, issued to U.S. Appl. No. 13/015,357, (30 pages).
U.S. Office action dated Aug. 8, 2013, for cross reference U.S. Appl. No. 13/093,707, (7 pages).
U.S. Office Action dated Dec. 13, 2011 for U.S. Appl. No. 12/849,193 (30 pages).
U.S. Office action dated Dec. 13, 2013, issued to U.S. Appl. No. 13/180,454 (18 pages).
U.S. Office action dated Dec. 16, 2013 for U.S. Appl. No. 14/054,536 (35 pages).
U.S. Office action dated Dec. 17, 2012, issued to U.S. Appl. No. 12/873,556 (37 pages).
U.S. Office action dated Dec. 2, 2013, issued to U.S. Appl. No. 13/157,220 (33 pages).
U.S. Office action dated Dec. 26, 2012, issued to U.S. Appl. No. 12/815,673 (21 pages).
U.S. Office action dated Feb. 11, 2014, for cross reference U.S. Appl. No. 13/178,472 (8 pages).
U.S. Office action dated Feb. 26, 2013, issued to U.S. Appl. No. 12/794,093 (31 pages).
U.S. Office action dated Feb. 6, 2014, for U.S. Appl. No. 12/984,231 (16 pages).
U.S. Office action dated Jan. 25, 2013, issued to U.S. Appl. No. 13/015,357 (21 pages).
U.S. Office action dated Jul. 11, 2013 for U.S. Appl. No. 13/461,669 (27 pages).
U.S. Office action dated Jul. 17, 2013, issued to U.S. Appl. No. 12/984,231, (18 pages).
U.S. Office action dated Jul. 24, 2013, issued to U.S. Appl. No. 12/784,804, (52 pages).
U.S. Office action dated Jul. 3, 2013 in U.S. Appl. No. 12/873,689 (48 pages).
U.S. Office action dated Jul. 5, 2013, issued to U.S. Appl. No. 12/873,556, (17 pages).
U.S. Office Action dated Jun. 11, 2013 for U.S. Appl. No. 12/979,656 (50 pages).
U.S. Office action dated Jun. 11, 2013, issued to U.S. Appl. No. 12/862,125 (37 pages).
U.S. Office action dated Jun. 17, 2013, for cross reference U.S. Appl. No. 13/180,454, (23 pages).
U.S. Office action dated Jun. 17, 2014, issued to U.S. Appl. No. 13/157,220 (36 pages).
U.S. Office Action dated Jun. 21, 2011 for U.S. Appl. No. 12/862,153 (21 pages).
U.S. Office action dated Jun. 26, 2013, issued to U.S. Appl. No. 12/794,093 (20 pages).
U.S. Office action dated Mar. 15, 2013, issued to U.S. Appl. No. 12/813,786 (33 pages).
U.S. Office action dated Mar. 17, 2014, for U.S. Appl. No. 12/950,361 (48 pages).
U.S. Office action dated Mar. 18, 2013, issued to U.S. Appl. No. 12/984,231 (29 pages).
U.S. Office action dated Mar. 19, 2013, issued to U.S. Appl. No. 13/194,759 (36 pages).
U.S. Office action dated Mar. 22, 2013, issued to U.S. Appl. No. 12/987,569 (12 pages).
U.S. Office Action dated Mar. 23, 2012 for U.S. Appl. No. 12/849,193 (17 pages).
U.S. Office action dated May 21, 2014, issued to U.S. Appl. No. 13/014,225 (15 pages).
U.S. Office action dated May 22, 2013, for cross reference U.S. Appl. No. 13/219,427, (26 pages).
U.S. Office action dated May 24, 2013, for U.S. Appl. No. 13/279,077 (20 pages).
U.S. Office action dated May 24, 2013, issued to U.S. Appl. No. 12/849,092 (31 pages).
U.S. Office Action dated May 7, 2013, issued in U.S. Appl. No. 12/820,270 (37 pages).
U.S. Office action dated Nov. 20, 2013, for cross reference U.S. Appl. No. 12/868,099, (14 pages).
U.S. Office action dated Nov. 22, 2013, issued to U.S. Appl. No. 13/198,591, (28 pages).
U.S. Office action dated Nov. 25, 2013, issued to U.S. Appl. No. 13/176,701, (49 pages).
U.S. Office action dated Nov. 4, 2013, for U.S. Appl. No. 13/219,427, (26 pages).
U.S. Office action dated Oct. 1, 2013, issued to U.S. Appl. No. 12/849,092, (13 pages).
U.S. Office action dated Oct. 11, 2013, issued to U.S. Appl. No. 12/907,396, (44 pages).
U.S. Office action dated Oct. 21, 2013, issued to U.S. Appl. No. 12/987,569, (14 pages).
U.S. Office Action dated Oct. 3, 2012 for U.S. Appl. No. 12/869,830 (28 pages).
U.S. Office action dated Oct. 7, 2013, issued to U.S. Appl. No. 13/279,077, (29 pages).
U.S. Office action dated Sep. 20, 2013, issued to U.S. Appl. No. 13/014,225, (33 pages).
U.S. Office action dated Sep. 25, 2013, for U.S. Appl. No. 13/031,756, (34 pages).
U.S. Office action dated Sep. 27, 2013, issued to U.S. Appl. No. 12/814,816 (19 pages).
U.S. Patent Office Action dated May 16, 2013, issued to U.S. Appl. No. 13/235,337 (28 pages).
US Notice of Allowance, dated Mar. 18, 2013, issued to U.S. Appl. No. 12/795,001 (29 pages).
US Office action dated Dec. 20, 2012, issued to U.S. Appl. No. 12/984,289 (20 pages).
US Office action dated Sep. 12, 2012, in U.S. Appl. No. 12/815,673 (26 pages).

* cited by examiner

ORGANIC LAYER DEPOSITION APPARATUS

CROSS-REFERENCE TO RELATED PATENT APPLICATION

This application claims priority to and the benefit of Korean Patent Application No. 10-2011-0066125, filed on Jul. 4, 2011, in the Korean Intellectual Property Office, the disclosure of which is incorporated herein in its entirety by reference.

BACKGROUND

1. Field

One or more aspects of embodiments according to the present invention relate to an organic layer deposition apparatus and a method of manufacturing an organic light-emitting display device by using the same.

2. Description of Related Art

Organic light-emitting display devices have a larger viewing angle, better contrast characteristics, and a faster response speed than other display devices, and thus have drawn attention as next-generation display devices.

An organic light-emitting display device includes an intermediate layer, which includes an emission layer, between a first electrode and a second electrode that are arranged opposite to each other. The electrodes and the intermediate layer may be formed via various methods, one of which is to perform a separate deposition method for each of the electrodes and the intermediate layer. When an organic light-emitting display device is manufactured by using the separate deposition method, a fine metal mask (FMM) having the same pattern as an organic layer to be formed is typically disposed to closely contact a substrate, and an organic material is deposited over the FMM in order to form the organic layer having a desired pattern.

SUMMARY

In order to address the drawback of the separate deposition method using an FMM, one or more aspects of embodiments according to the present invention provide an organic layer deposition apparatus that may be simply applied to produce large-sized display devices on a mass scale and that may be precisely aligned with respect to a substrate during a deposition process.

According to an aspect according to embodiments of the present invention, there is provided an organic layer deposition apparatus for forming an organic layer on a substrate. The apparatus includes a deposition source configured to discharge a deposition material; a deposition source nozzle unit located at a side of the deposition source and including a plurality of deposition source nozzles arranged in a first direction; and a patterning slit sheet located opposite to the deposition source nozzle unit and having a plurality of patterning slits arranged in a second direction perpendicular to the first direction. The patterning slit sheet is smaller in at least one of the first and second directions than the substrate. Deposition is performed while the substrate is spaced from the patterning slit sheet, and is moved relative to the organic layer deposition apparatus in the first direction. The patterning slit sheet includes a first alignment mark and a second alignment mark that are located apart from each other. The substrate includes a first alignment pattern and a second alignment pattern that are located apart from each other. The organic layer deposition apparatus further includes a first camera assembly for photographing the first alignment mark and the first alignment pattern, and a second camera assembly for photographing the second alignment mark and the second alignment pattern. A moving speed of the substrate is synchronized with shooting speeds of the first and second camera assemblies so that when the substrate is appropriately aligned with the organic layer deposition apparatus, images of the first alignment pattern captured by the first camera assembly are substantially the same as each other, and images of the second alignment pattern captured by the second camera assembly are substantially the same as each other.

The deposition source, the deposition source nozzle unit, and the patterning slit sheet may be integrally formed as one body.

The deposition source and the deposition source nozzle unit, and the patterning slit sheet may be integrally connected as one body by connection members for guiding movement of the deposition material.

The connection members may be formed to seal a space between the deposition source, the deposition source nozzle unit, and the patterning slit sheet.

The plurality of deposition source nozzles may be tilted at an angle.

The plurality of deposition source nozzles may include deposition source nozzles arranged in two rows in the first direction. The deposition source nozzles in the two rows may be tilted to face each other.

The plurality of deposition source nozzles may include deposition source nozzles arranged in two rows in the first direction. The deposition source nozzles of a row located at a first side of the patterning slit sheet from among the two rows may be arranged to face a second side of the patterning slit sheet. The deposition source nozzles of the other row located at a second side of the patterning slit sheet from among the two rows may be arranged to face a first side of the patterning slit sheet.

The first alignment pattern may include a plurality of first marks arranged along the first direction, the second alignment pattern may include a plurality of second marks arranged along the first direction, and the first alignment pattern and the second alignment pattern may be spaced apart from each other in the second direction.

Shapes and sizes of the plurality of first marks and the plurality of second marks may be the same.

Distances between the plurality of first marks may be substantially equal to distances between the plurality of second marks.

Each of the plurality of first marks and the plurality of second marks may have a shape of a cross.

Each of the plurality of first marks or the plurality of second marks may have a polygonal shape.

Each of the plurality of first marks or the plurality of second marks may have a triangular shape.

The first alignment pattern and the second alignment pattern may have a sawtooth shape.

The substrate may be moved at a substantially uniform velocity in the first direction, the first and second camera assemblies may respectively photograph the first alignment pattern and the second alignment pattern at time intervals, the first camera assembly may capture a number of images each containing the first alignment patterns, and the second camera assembly may capture a number of images each containing the second alignment patterns, which is equal to the number of images each containing the first alignment pattern.

The first camera assembly and the second camera assembly may be positioned over the substrate to respectively correspond to the first alignment mark and the second alignment mark.

The organic layer deposition apparatus may further include a controller for determining a degree to which the substrate and the patterning slit sheet are aligned with each other, based on information captured by the first camera assembly and the second camera assembly.

The controller may determine the degree to which the substrate and the patterning slit sheet are aligned with each other in the second direction perpendicular to the first direction, by comparing a first distance between images of the first alignment pattern and the first alignment mark photographed by the first camera assembly, with a second distance between images of the second alignment pattern and the second alignment mark photographed by the second camera assembly.

The controller may determine whether or not the patterning slit sheet is tilted in the first direction, by comparing an image of the first alignment mark captured by the first camera assembly, with an image of the second alignment mark captured by the second camera assembly.

The controller may determine a difference between locations of the captured image of the first alignment mark and the captured image of the second alignment mark in the first direction, may determine that the patterning slit sheet is tilted toward the first alignment mark in the first direction when the captured image of the second alignment mark is located ahead of the captured image of the first alignment mark, and may determine that the patterning slit sheet is tilted toward the second alignment mark in the first direction when the captured image of the second alignment mark is located behind the captured image of the first alignment mark.

The controller may determine whether or not the substrate is tilted in the first direction, by comparing an image of the first alignment pattern captured by the first camera assembly, with an image of the second alignment pattern captured by the second camera assembly.

The controller may determine a difference between locations of the captured image of the first alignment mark and the captured image of the second alignment mark in the first direction, may determine that the substrate is tilted toward the first alignment mark in the first direction when the captured image of the second alignment mark is located ahead of the captured image of the first alignment mark, and may determine that the substrate is tilted toward the second alignment mark in the first direction when the captured image of the second alignment mark is located behind the captured image of the first alignment mark.

The substrate and the patterning slit sheet may be aligned with each other by moving the substrate or the patterning slit sheet, based on the degree of alignment, determined by the controller.

The patterning slit sheet may further include a third alignment mark spaced apart from the first alignment mark in the first direction, and a fourth alignment mark spaced apart from the second alignment mark in the first direction.

A distance between the first and third alignment marks may be equal to a distance between the second and fourth alignment marks.

The first and second alignment marks may be spaced apart from each other in the second direction, and the third and fourth alignment marks may be spaced apart from each other in the second direction.

A distance between the first and second alignment marks may be substantially equal to a distance between the third and fourth alignment marks.

The organic layer deposition apparatus may further include a third camera assembly and a fourth camera assembly. The third and fourth camera assemblies may be positioned over the substrate to respectively correspond to the third and fourth alignment marks.

According to another aspect of the present invention, there is provided an organic layer deposition apparatus for forming an organic layer on a substrate, the apparatus including a deposition source configured to discharge a deposition material; a deposition source nozzle unit located at a side of the deposition source and including a plurality of deposition source nozzles arranged in a first direction; a patterning slit sheet located opposite to the deposition source nozzle unit and having a plurality of patterning slits arranged in the first direction, the patterning slit sheet being smaller than the substrate in at least one of the first direction or a second direction substantially perpendicular to the first direction; and a barrier plate assembly including a plurality of barrier plates that are located between the deposition source nozzle unit and the patterning slit sheet in the first direction and that partition a space between the deposition source nozzle unit and the patterning slit sheet into a plurality of sub-deposition spaces. The organic layer deposition apparatus and the substrate are spaced apart from each other. The organic layer deposition apparatus or the substrate is moved relative to the other during deposition. The substrate includes a first alignment pattern and a second alignment pattern that are disposed apart from each other. The organic layer deposition apparatus further includes a first camera assembly for photographing the first alignment mark and the first alignment pattern, and a second camera assembly for photographing the second alignment mark and the second alignment pattern. A moving speed of the substrate is synchronized with shooting speeds of the first and second camera assemblies so that when the substrate is appropriately aligned with the organic deposition apparatus, images of the first alignment pattern captured by the first camera assembly are substantially the same as each other, and images of the second alignment pattern captured by the second camera assembly are substantially the same as each other.

The plurality of barrier plates may extend in the second direction substantially perpendicular to the first direction.

The barrier plate assembly may include a first barrier plate assembly including a plurality of first barrier plates, and a second barrier plate assembly including a plurality of second barrier plates.

The plurality of first barrier plates and the plurality of second barrier plates may extend in the second direction substantially perpendicular to the first direction.

The plurality of first barrier plates may be arranged to respectively correspond to the plurality of second barrier plates.

The first alignment pattern may include a plurality of first marks arranged along the first direction. The second alignment pattern may include a plurality of second marks arranged along the first direction. The first alignment pattern and the second alignment pattern may be spaced apart from each other in the second direction.

Shapes and sizes of the plurality of first marks and the plurality of second marks may be the same.

Distances between the plurality of first marks may be equal to distances between the plurality of second marks.

Each of the plurality of first marks and the plurality of second marks may have a shape of a cross.

Each of the plurality of first marks or the plurality of second marks may have a polygonal shape.

The substrate may be moved at a substantially uniform velocity in the first direction, the first and second camera assemblies may respectively photograph the first alignment pattern and the second alignment pattern at time intervals, the first camera assembly may capture a number of images each containing the first alignment patterns, and the second camera assembly may capture a number of images each containing the second alignment patterns, which is equal to the number of images each containing the first alignment pattern.

The first camera assembly and the second camera assembly may be positioned over the substrate to respectively correspond to the first alignment mark and the second alignment mark.

The organic layer deposition apparatus may further include a controller for determining a degree to which the substrate and the patterning slit sheet are aligned with each other, based on information captured by the first camera assembly and the second camera assembly.

The controller may determine the degree to which the substrate and the patterning slit sheet are aligned with each other in the second direction substantially perpendicular to the first direction, by comparing a first distance between images of the first alignment pattern and the first alignment mark photographed by the first camera assembly, with a second distance between images of the second alignment pattern and the second alignment mark photographed by the second camera assembly.

The controller may determine whether or not the patterning slit sheet is tilted in the first direction, by comparing an image of the first alignment mark captured by the first camera assembly, with an image of the second alignment mark captured by the second camera assembly.

The controller may determine a difference between locations of the captured image of the first alignment mark and the captured image of the second alignment mark in the first direction, may determine that the patterning slit sheet is tilted toward the first alignment mark in the first direction when the captured image of the second alignment mark is located ahead of the captured image of the first alignment mark, and may determine that the patterning slit sheet is tilted toward the second alignment mark in the first direction when the captured image of the second alignment mark is located behind the captured image of the first alignment mark.

The controller may determine whether or not the substrate is tilted in the first direction, by comparing an image of the first alignment pattern captured by the first camera assembly, with an image of the second alignment pattern captured by the second camera assembly.

The controller may determine a difference between locations of the captured image of the first alignment mark and the captured image of the second alignment mark in the first direction, may determine that the substrate is tilted toward the first alignment mark in the first direction when the captured image of the second alignment mark is located ahead of the captured image of the first alignment mark, and may determine that the substrate is tilted toward the second alignment mark in the first direction when the captured image of the second alignment mark is located behind the captured image of the first alignment mark.

The substrate and the patterning slit sheet may be aligned with each other by moving the substrate or the patterning slit sheet, based on the degree of alignment, determined by the controller.

The patterning slit sheet may further include a third alignment mark spaced apart from the first alignment mark in the first direction, and a fourth alignment mark spaced apart from the second alignment mark in the first direction.

The organic layer deposition apparatus may further include a third camera assembly and a fourth camera assembly. The third and fourth camera assemblies may be positioned over the substrate to respectively correspond to the third and fourth alignment marks.

BRIEF DESCRIPTION OF THE DRAWINGS

The above and other features of the present invention will become more apparent by describing in detail exemplary embodiments thereof with reference to the attached drawings in which.

DETAILED DESCRIPTION

Figure 1:
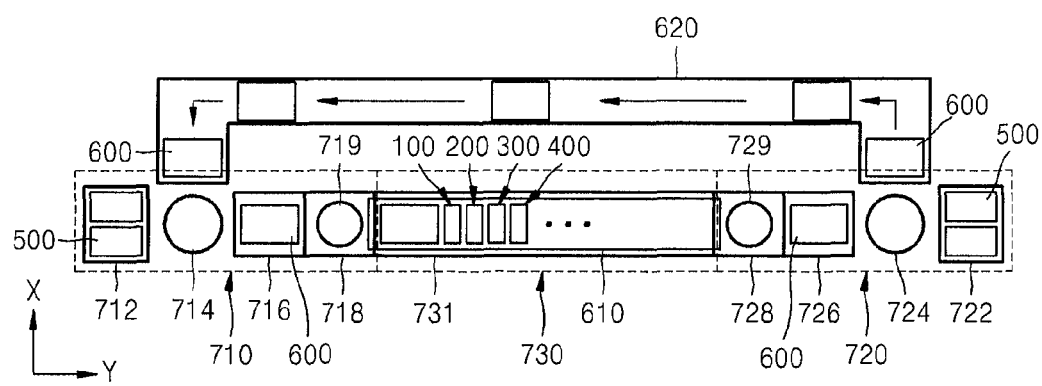
FIG. 1 is a schematic view of an organic layer deposition system including an organic layer deposition apparatus, according to an embodiment of the present invention.

The present invention will now be described more fully with reference to the accompanying drawings in which exemplary embodiments of the invention are shown. In the drawings, the thicknesses of layers and regions are exaggerated for clarity. Like reference numerals in the drawings denote like elements, and thus redundant or duplicate descriptions may be omitted.

In general, a deposition method using a fine metal mask (FMM) is not suitable for manufacturing larger devices using a mother glass having a size of 5G, i.e., 1100 mm×1300 mm, or greater. In other words, when such a large mask is used, the mask may bend due to its own weight, thereby distorting a pattern. This is not conducive for the recent trend towards high-definition patterns.

Figure 2:
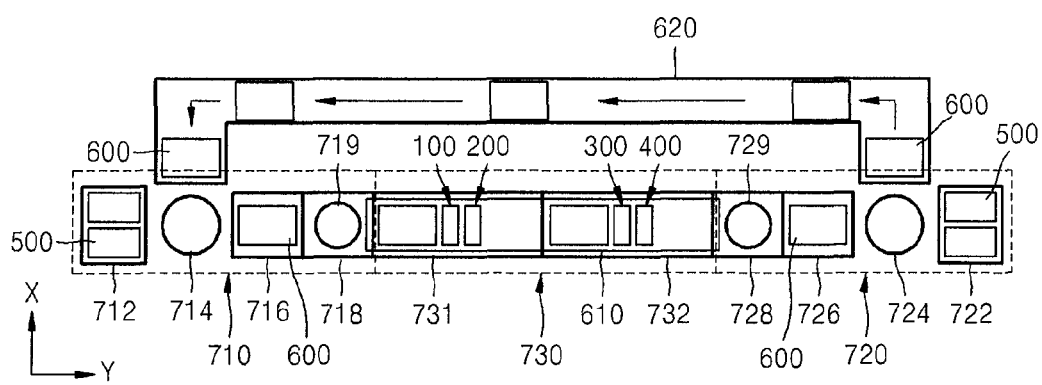
FIG. 2 illustrates a modified example of the organic layer deposition system of FIG. 1.

FIG. 1 is a schematic view of an organic layer deposition system including an organic layer deposition apparatus, according to an embodiment of the present invention. FIG. 2 illustrates a modified example of the organic layer deposition system of FIG. 1.

Referring to FIG. 1, the organic layer deposition system includes a loading unit 710, a deposition unit 730, an unloading unit 720, a first conveyer unit 610, and a second conveyer unit 620.

The loading unit 710 may include a first rack 712, a transport robot 714, a transport chamber 716, and a first inversion chamber 718.

A plurality of substrates 500 onto which a deposition material is not applied are stacked up on the first rack 712. The transport robot 714 picks up one of the substrates 500 from the first rack 712, places it on an electrostatic chuck 600 transferred by the second conveyer unit 620, and moves the electrostatic chuck 600 on which the substrate 500 is disposed, into the transport chamber 716.

The first inversion chamber 718 is located adjacent to the transport chamber 716. A first inversion robot 719 located in the first inversion chamber 718 inverts the electrostatic chuck 600 and then loads it onto the first conveyer unit 610 of the deposition unit 730.

Referring to FIG. 1, the transport robot 714 places one of the substrates 500 on an upper surface of the electrostatic chuck 600, and the electrostatic chuck 600 on which the substrate 500 is disposed, is loaded into the transport chamber 716. The first inversion robot 719 inverts the electrostatic chuck 600 so that the substrate 500 is turned upside down in the deposition unit 730.

The unloading unit 720 is constituted to operate in an opposite manner to the loading unit 710 described above. Specifically, a second inversion robot 729 in a second inversion chamber 728 inverts the electrostatic chuck 600 having the substrate 500 thereon, which has passed through the deposition unit 730, and then moves the electrostatic chuck 600 having the substrate 500 disposed thereon, into an ejection chamber 726. Then, an ejection robot 724 removes the electrostatic chuck 600 having the substrate 500 disposed thereon from the ejection chamber 726, separates the substrate 500 from the electrostatic chuck 600, and then loads the substrate 500 onto the second rack 722. The electrostatic chuck 600 separated from the substrate 500 is returned back into the loading unit 710 via the second conveyer unit 620.

However, the present invention is not limited to the above description. For example, when the substrate 500 is initially disposed on the electrostatic chuck 600, the substrate 500 may be fixed onto a bottom surface of the electrostatic chuck 600 and then be moved into the deposition unit 730. In this case, for example, the first inversion chamber 718, the first inversion robot 719, the second inversion chamber 728, and the second inversion robot 729 are not used.

The deposition unit 730 may include at least one deposition chamber. Referring to FIG. 1, the deposition unit 730 may include a first chamber 731, in which first to four organic layer deposition assemblies 100, 200, 300, and 400 are located. Although FIG. 1 illustrates that a total of four organic layer deposition apparatuses, i.e., the first to fourth organic layer deposition apparatuses 100 to 400, are installed in the first chamber 731, the total number of organic layer deposition apparatuses that may be installed in the first chamber 731 may vary according to the deposition material and deposition conditions. The first chamber 731 is maintained in a vacuum state during a deposition process.

Referring to FIG. 2, according to another embodiment of the present invention, a deposition unit 730 may include a first chamber 731 and a second chamber 732 that are connected to each other, first and second organic deposition apparatuses 100 and 200 may be located in the first chamber 731, and third and fourth organic layer deposition apparatuses 300 and 400 may be located in the second chamber 732. According to another embodiment of the present invention, the organic layer deposition system may include more than two chambers.

In the embodiment illustrated in FIG. 1, the electrostatic chuck 600 on which the substrate 500 is disposed may be moved at least to the deposition unit 730 or may be moved sequentially to the loading unit 710, the deposition unit 730, and the unloading unit 720, by the first conveyor unit 610. The electrostatic chuck 600 that is separated from the substrate 500 in the unloading unit 720 is moved back to the loading unit 710 by the second conveyor unit 620.

Figure 3:
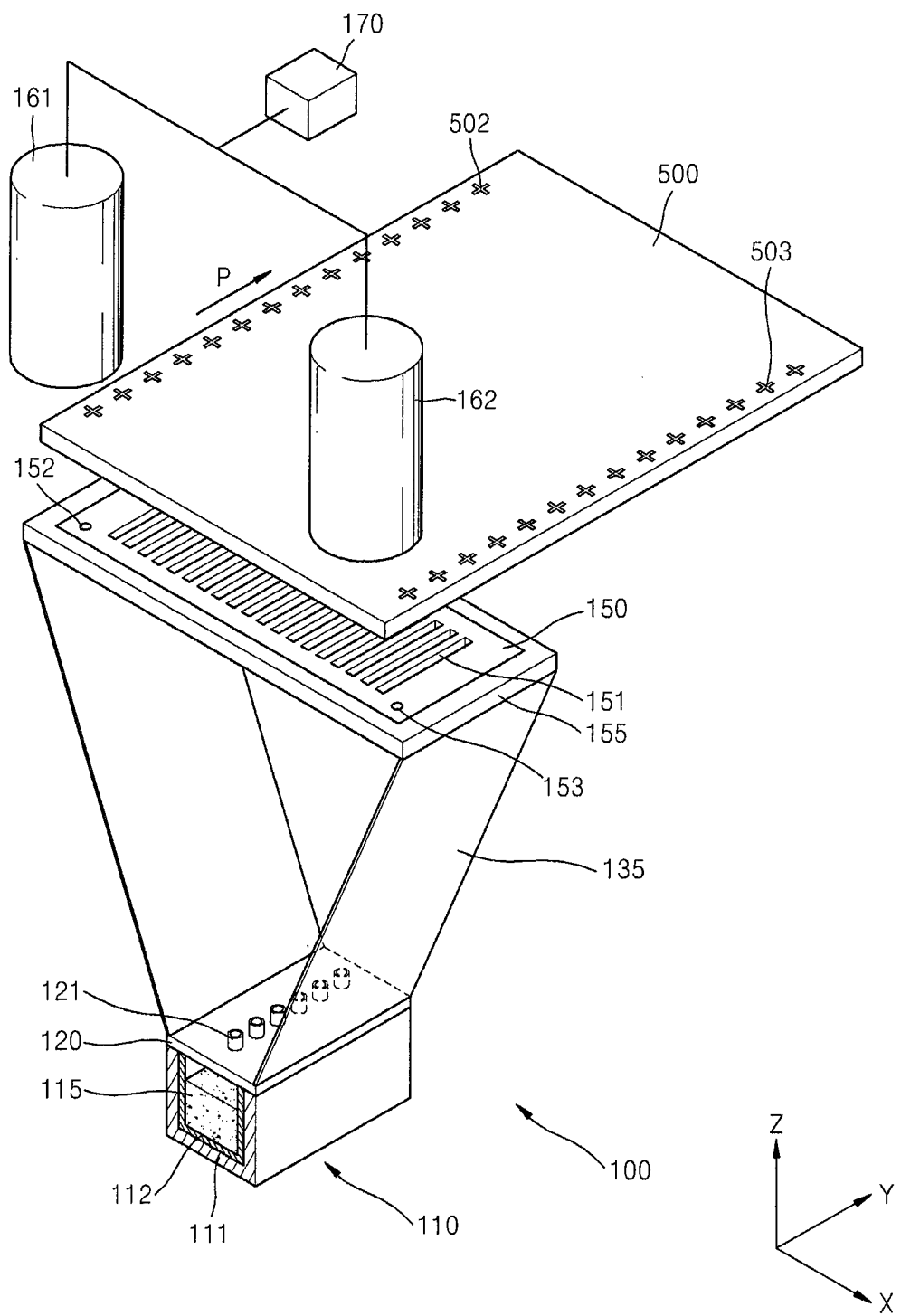
FIG. 3 is a schematic perspective view of an organic layer deposition apparatus according to an embodiment of the present invention.
Figure 4:
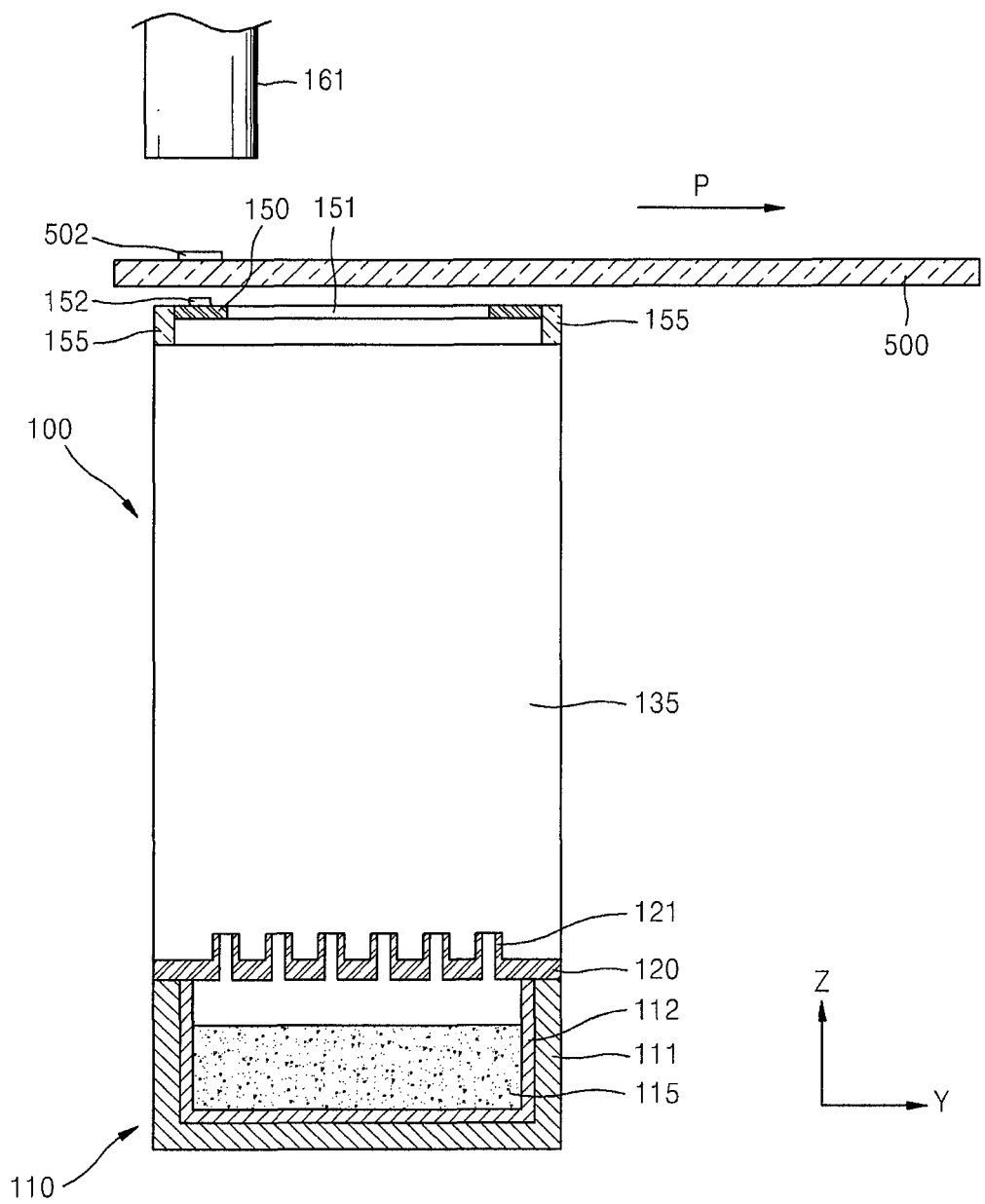
FIG. 4 is a schematic sectional view of the organic layer deposition apparatus of FIG. 3 taken in a plane parallel to the YZ plane.
Figure 5:
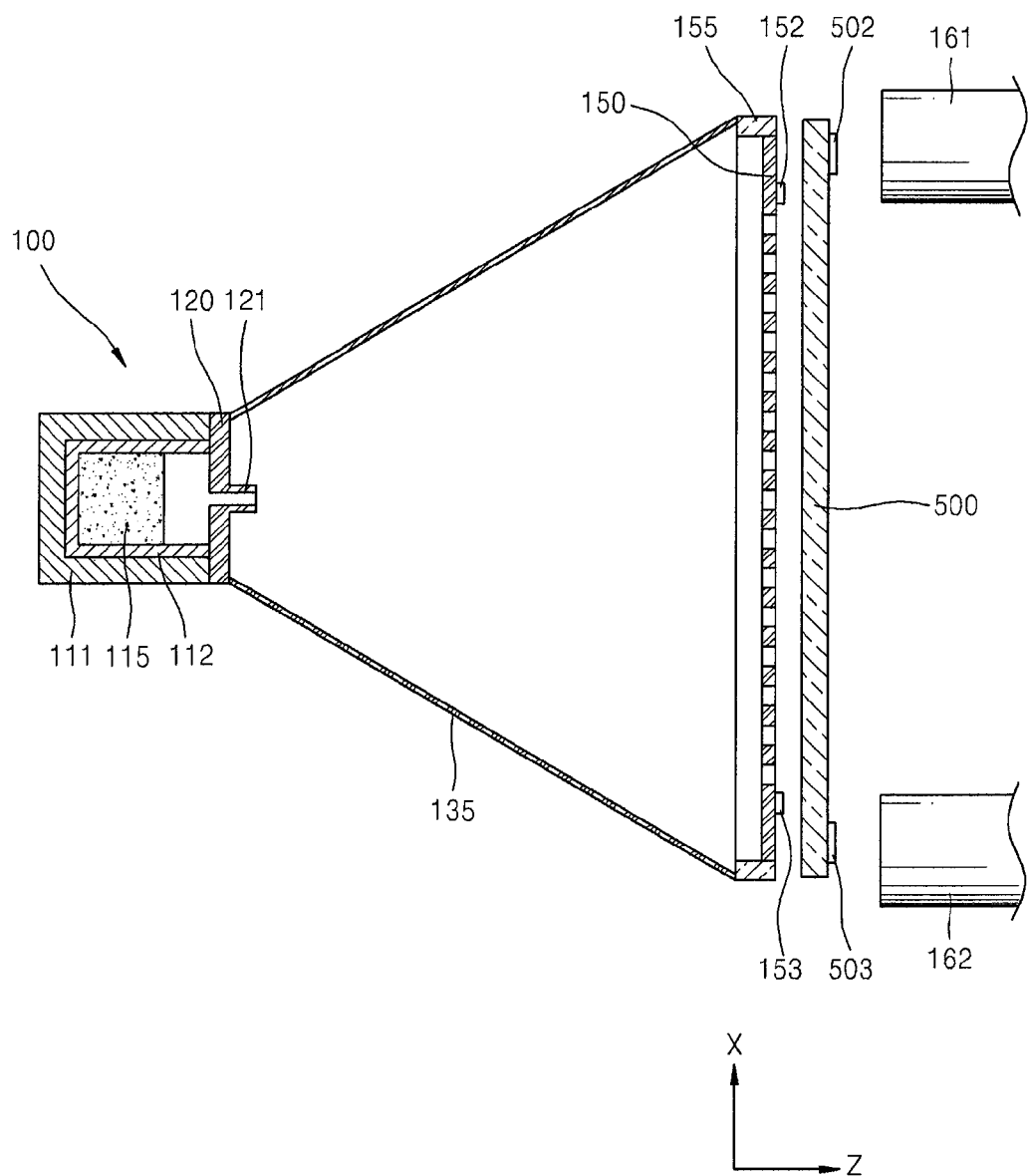
FIG. 5 is a schematic sectional view of the organic layer deposition apparatus of FIG. 3 taken in a plane parallel to the XZ plane.

FIG. 3 is a schematic perspective view of an organic layer deposition apparatus 100 according to an embodiment of the present invention. FIG. 4 is a schematic sectional view taken in a plane parallel to the YZ plane of the organic layer deposition apparatus 100 illustrated in FIG. 3. FIG. 5 is a schematic plan view taken in a plane parallel to the XZ plane of the organic layer deposition apparatus 100 illustrated in FIG. 3.

Referring to FIGS. 3 through 5, the organic layer deposition apparatus 100 according to the current embodiment includes a deposition source 110, a deposition source nozzle unit 120, a patterning slit sheet 150, a first camera assembly 161, a second camera assembly 162, and a controller 170.

Specifically, the first chamber 731 of FIG. 1 should be basically maintained in a high-vacuum state as in a deposition method using an FMM so that a deposition material 115 discharged from the deposition source 110 may pass through the deposition source nozzle unit 120 and the patterning slit sheet 150, and then be deposited onto a substrate 500 in a desired pattern. In addition, the temperature of the patterning slit sheet 150 should be sufficiently lower than the temperature of the deposition source 110. In this regard, the temperature of the patterning slit sheet 150 may be about 100° C. or less. The temperature of the patterning slit sheet 150 should be sufficiently low so as to reduce thermal expansion of the patterning slit sheet 150.

The substrate 500 that is a deposition target substrate is disposed in the first chamber 731. The substrate 500 may be a substrate for flat panel displays. A large substrate, such as a mother glass, for manufacturing a plurality of flat panel displays may be used as the substrate 500. Other substrates may also be employed.

In the current embodiment, deposition is performed while the substrate 500 is moved (e.g., continuously moved) relative to the organic layer deposition apparatus 100.

In particular, in a typical FMM deposition method, the size of an FMM is generally equal to the size of a substrate. Thus, since the size of the FMM is increased as the substrate becomes larger, it is neither straightforward to manufacture a large FMM nor to extend an FMM to be accurately aligned with a pattern.

In order to overcome this problem, in the organic layer deposition apparatus 100 according to the current embodiment, deposition may be performed while the organic layer deposition apparatus 100 or the substrate 500 is moved relative to the other. In other words, deposition may be continuously performed while the substrate 500, which is disposed such as to face the organic layer deposition apparatus 100, is moved in a Y-axis direction. That is, deposition may be performed in a scanning manner while the substrate 500 is moved in a direction indicated with an arrow P in FIG. 6, i.e., the first direction.

In the organic layer deposition apparatus 100 according to the current embodiment, the patterning slit sheet 150 may be smaller (e.g., significantly smaller) than an FMM used in the conventional deposition method. In other words, in the organic layer deposition apparatus 100, deposition is continuously performed, i.e., in a scanning manner while the substrate 500 is moved in the Y-axis direction. Thus, lengths of the patterning slit sheet 150 in the X-axis and/or Y-axis directions may be significantly less than the lengths of the substrate 500 in the X-axis and/or Y-axis directions. As described above, since the patterning slit sheet 150 may be formed to be smaller (e.g., significantly smaller) than an FMM used in the conventional deposition method, it is relatively easy to manufacture the patterning slit sheet 150 used in embodiments of the present invention. In other words, using the patterning slit sheet 150, which is smaller than an FMM used in the conventional deposition method, is more convenient in all processes, including etching and other subsequent processes, such as precise extension, welding, moving, and cleaning processes, compared to the conventional deposition method using the larger FMM. This can be more advantageous for a relatively large display device, for example.

The deposition source 110 that contains and heats the deposition material 115 is located at an opposite side of the first chamber 731 to a side at which the substrate 500 is located. While being vaporized in the deposition source 110, the deposition material 115 is deposited on the substrate 500.

For example, the deposition source 110 includes a crucible 112 filled with the deposition material 115, and a cooling block 111 that heats the crucible 112 to vaporize the deposition material 115 in the crucible 112 towards a side of the crucible 112, and in particular, towards the deposition source nozzle unit 120. The cooling block 111 prevents or reduces radiation of heat from the crucible 112 outside, i.e., into the chamber. The cooling block 111 may include a heater (not shown) that heats the crucible 112.

The deposition source nozzle unit 120 is located at a side of the deposition source 110, and in particular, at the side of the deposition source 110 facing the substrate 500. The deposition source nozzle unit 120 includes a plurality of deposition source nozzles 121 that may be arranged at equal intervals in the Y-axis direction, i.e., a scanning direction of the substrate 500. The deposition material 115 that is vaporized in the deposition source 110, passes through the deposition source nozzle unit 120 towards the substrate 500. As described above, when the deposition source nozzle unit 120 includes the plurality of deposition source nozzles 121 arranged in the Y-axis direction, that is, in the scanning direction of the substrate 500, the size of a pattern formed of the deposition material 115 discharged through each of a plurality of patterning slits 151 of the patterning slit sheet 150 is affected by the size of one of the deposition source nozzles 121 (since there is only one deposition source nozzle 121 in the X-axis direction). Thus, no shadow zone may be formed on the substrate 500. In addition, since the plurality of deposition source nozzles 121 are arranged in the scanning direction of the substrate 500, even if there is a difference in flux between the deposition source nozzles 121, the difference may be compensated for and deposition uniformity may be maintained constantly or substantially constantly.

The patterning slit sheet 150 and a frame 155 are located between the deposition source 110 and the substrate 500. A shape of the frame 155 is similar to a window frame. The patterning slit sheet 150 is bound inside the frame 155. The patterning slit sheet 150 has the plurality of patterning slits 151 arranged in the X-axis direction. The deposition material 115 that is vaporized in the deposition source 110, passes through the deposition source nozzle unit 120 and the patterning slit sheet 150 towards the substrate 500. The patterning slit sheet 150 may be manufactured by etching, which is the same method as used in a conventional method of manufacturing an FMM, and in particular, a striped FMM. In this regard, the total number of patterning slits 151 may be greater than the total number of deposition source nozzles 121.

In addition, the deposition source 110 and the deposition source nozzle unit 120 coupled to the deposition source 110 may be arranged to be separated from the patterning slit sheet 150 by a distance (e.g., a predetermined distance). The deposition source 110 and the deposition source nozzle unit 120 coupled to the deposition source 110 may be connected to the patterning slit sheet 150 by connection members 135. That is, the deposition source 110, the deposition source nozzle unit 120, and the patterning slit sheet 150 may be integrally formed as one body by being connected to each other via the connection members 135. The first connection members 135 may guide the deposition material 115 discharged through the deposition source nozzles 121 to move straight and not to flow in the X-axis direction. Referring to the embodiment illustrated in FIG. 4, the connection members 135 are formed on only left and right sides of the deposition source 110, the deposition source nozzle unit 120, and the patterning slit sheet 150 to guide the deposition material 115 to not flow in the X-axis direction; however, aspects of the present invention are not limited thereto. For example, the connection members 135 may be formed in the form of a sealed box so as to guide the deposition material 115 to not flow in both the X-axis and Y-axis directions.

As described above, the organic layer deposition apparatus 100 according to the current embodiment performs deposition while being moved relative to the substrate 500. In order to move the organic layer deposition apparatus 100 relative to the substrate 500, the patterning slit sheet 150 is located apart from the substrate 500 by a distance (e.g., a predetermined distance).

In particular, in the conventional deposition method using an FMM, deposition is performed with the FMM in close contact with a substrate in order to prevent formation of a shadow zone on the substrate. However, when the FMM is used in close contact with the substrate, the contact may cause defects. In addition, in the typical deposition method, the size of the mask is the same as the size of the substrate since the mask cannot be moved relative to the substrate. Thus, the size of the mask becomes increased as display devices become larger. However, it is not easy to manufacture such a large mask.

In order to overcome this problem, in the organic layer deposition apparatus 100 according to the current embodiment, the patterning slit sheet 150 is arranged to be located (or positioned) apart from the substrate 500 by a distance (e.g., a predetermined distance).

As described above, according to embodiments of the present invention, a mask is formed to be smaller than a substrate, and deposition is performed while the mask is moved relative to the substrate. Thus, the mask can be easily manufactured. In addition, defects caused due to the contact between a substrate and an FMM, which may occur in the conventional deposition method, may be prevented. Furthermore, since it is unnecessary to position the patterning slit sheet 150 (unlike the FMM) in close contact with the substrate during a deposition process, the manufacturing time may be reduced.

In an embodiment of the present invention, the organic layer deposition apparatus 100 may further include first and second alignment patterns 502 and 503, first and second alignment marks 152 and 153, first and second camera assemblies 161 and 162, and a controller 170 so as to align the substrate 500 and the patterning slit sheet 150 with each other.

The first and second alignment patterns 502 and 503 are formed on the substrate 500 along a moving direction P of the substrate 500. The first and second alignment patterns 502 and 520 may be formed at both ends of the substrate 500 to be disposed apart from each other. The first alignment pattern 502 may include a plurality of first marks 502a arranged along the moving direction P of the substrate 500, and the second alignment pattern 503 may include a plurality of second marks 503a arranged along the moving direction P of the substrate 500. Each of the plurality of first marks 502a and the plurality of second marks 503a may have a shape of a cross, for example. The distances between two immediately adjacent ones (e.g., closest ones) of the plurality of first marks 502a may be the same, and the distances between two immediately adjacent ones of the plurality of second marks 503a may also be the same. Additionally and/or alternatively, the distances between two immediately adjacent ones of the plurality of first marks 502a may be equal to those between two immediately adjacent ones of the plurality of second marks 503a.

The first and second alignment marks 152 and 153 may be located at or near respective ends (e.g., ends in a longitudinal or lengthwise direction) of the patterning slit sheet 150. The first and second alignment marks 152 and 153 may be positioned apart from each other in a direction (a second direction) perpendicular to the moving direction P. Each of the first and second alignment marks 152 and 153 may have a circular shape. However, the present invention is not limited thereto, and each of the first and second alignment marks 152 and 153 may have a polygonal shape or any other suitable shape. For example, if each of the first and second alignment marks 152 and 153 has a right-angled triangle (e.g., right triangle) shape, then oblique sides of the first and second alignment marks 152 and 153 may face the patterning slits 151.

When the substrate 500 and the patterning slit sheet 150 are appropriately aligned with each other, then the first and second alignment marks 152 and 153 are located between the first and second alignment patterns 502 and 503. This will be described later.

The first and second camera assemblies 161 and 162 may be located on or above the substrate 500 to respectively correspond to the first and second alignment marks 152 and 153. The first camera assembly 161 may photograph the first alignment pattern 502 and the first alignment mark 152 on the substrate 500, and the second camera assembly 162 may photograph the second alignment pattern 503 and the second alignment mark 153 on the substrate 500. Since the substrate 500 is transparent, the first and second camera assemblies 161 and 162 may respectively photograph the first and second alignment marks 152 and 153, viewed from the substrate 500. The first and second camera assemblies 161 and 162 are aligned in the second direction perpendicular to the moving direction P.

The controller 170 may determine a degree to which the substrate 500 and the patterning slit sheet 150 are aligned to each other by analyzing information captured by the first and second camera assemblies 161 and 162, and may control a driver (not shown) to move the substrate 500 or the patterning slit sheet 150, based on the degree of alignment.

Alignment of the substrate 500 with the patterning slit sheet 150 illustrated in FIG. 3 will now be described with reference to FIGS. 6 to 12.

Figure 6:
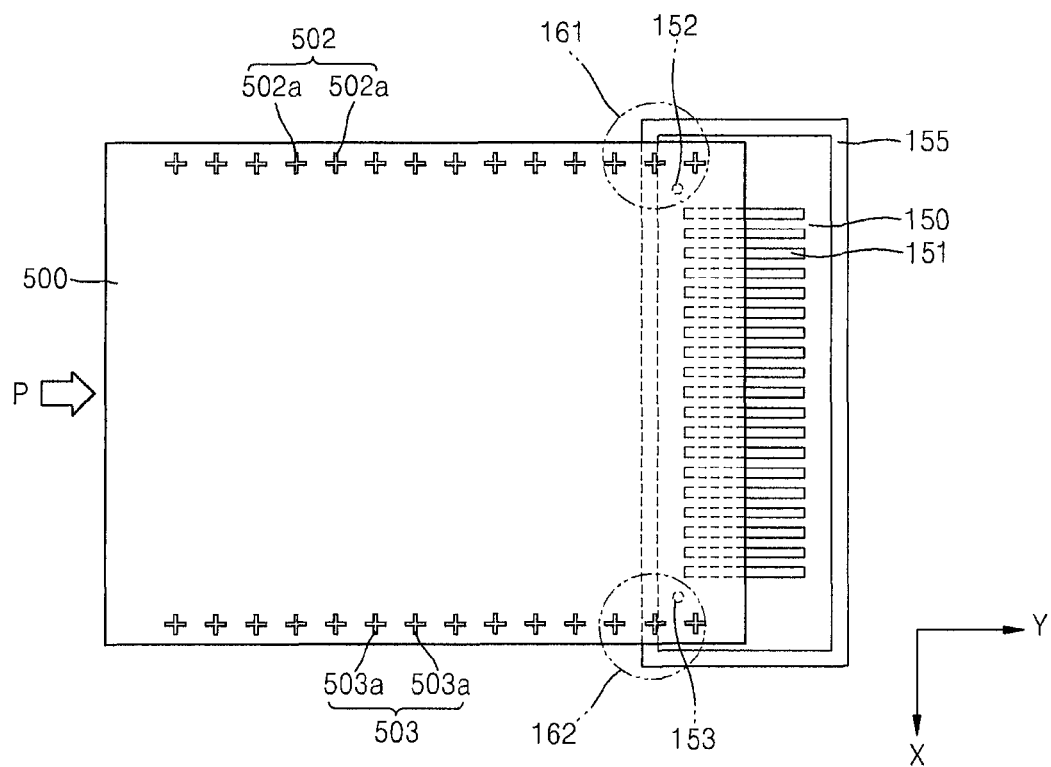
FIG. 6 is a plan view illustrating an arrangement of a substrate and a patterning slit sheet, according to an embodiment of the present invention.

FIG. 6 is a plan view illustrating an arrangement of a substrate 500 and a patterning slit sheet 150, viewed from the first and second camera assemblies 161 and 162 of FIG. 3, according to an embodiment of the present invention.

Referring to FIG. 6, the substrate 500 is moved in a Y-axis direction. The first and second alignment patterns 502 and 503 are arranged in parallel with the Y-axis direction in which the substrate 500 is moved. The first and second alignment patterns 502 and 503 may be located at respective ends of the substrate 500 to be spaced apart from each other in an X-axis direction (second direction) perpendicular to the Y-axis direction.

The first and second alignment marks 152 and 153 located on the patterning slit sheet 150 may be spaced apart from each other in the second direction, and may be located between the first and second alignment patterns 502 and 503.

Figure 7:
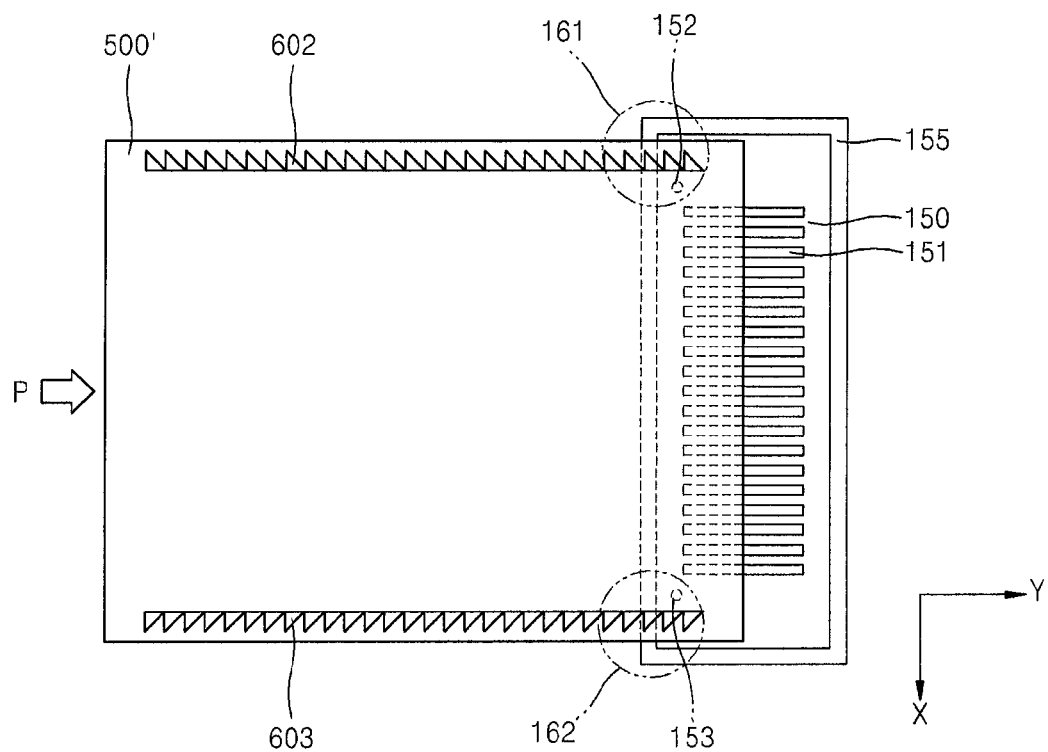
FIG. 7 is a plan view illustrating a modified example of the arrangement of FIG. 6.

FIG. 7 is a plan view illustrating a modified example of the arrangement of FIG. 6. Referring to FIG. 7, a substrate 500' may include a first alignment pattern 602 and a second alignment pattern 603 each having a plurality of triangular shapes. In each of the first and second alignment patterns 602 and 603, a plurality of alignment marks each having a right-angled triangular (e.g., right triangle) shape may be continuously arranged in the form of a sawtooth. However, the present invention is not limited thereto, and for example, a plurality of polygonal-shaped alignment marks may be continuously arranged in each of the first and second alignment marks 602 and 603.

Figure 8:
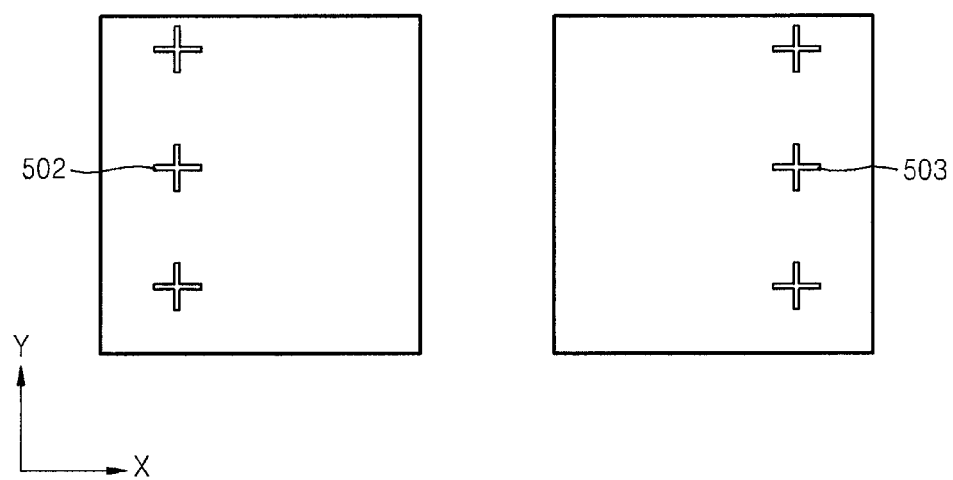
FIG. 8 illustrates images of first and second alignment patterns 502 and 503 that are respectively captured with the first and second camera assemblies 161 and 162 of FIG. 3, according to an embodiment of the present invention.

FIG. 8 illustrates images of first and second alignment patterns 502 and 503 that are respectively captured with the first and second camera assemblies 161 and 162 of FIG. 3, according to an embodiment of the present invention. Specifically, in FIG. 8, a left diagram denotes an image of the first alignment pattern 502 captured by the first camera assembly 161, and a right diagram denotes an image of the second alignment pattern 503 captured by the second camera assembly 162. Since shooting speeds of the first and second camera assemblies 161 and 162 may be synchronized with a moving speed of the substrate 500, the first camera assembly 161 may capture same images (or substantially the same images) of the first alignment pattern 502 and the second camera assembly 161 may capture same images (or substantially the same images) of the second alignment pattern 503. More specifically, each of the first and second camera assemblies 161 and 162 may capture an image of the substrate 500 moving at time intervals (e.g., predetermined time intervals). Since the substrate 500 is moved at a regular speed during shooting operations of the first and second camera assemblies 161 and 162, the first and second camera assemblies 161 and 162 may respectively capture the same images (or substantially the same images) of the first and second alignment patterns 502 and 503.

Figure 9:
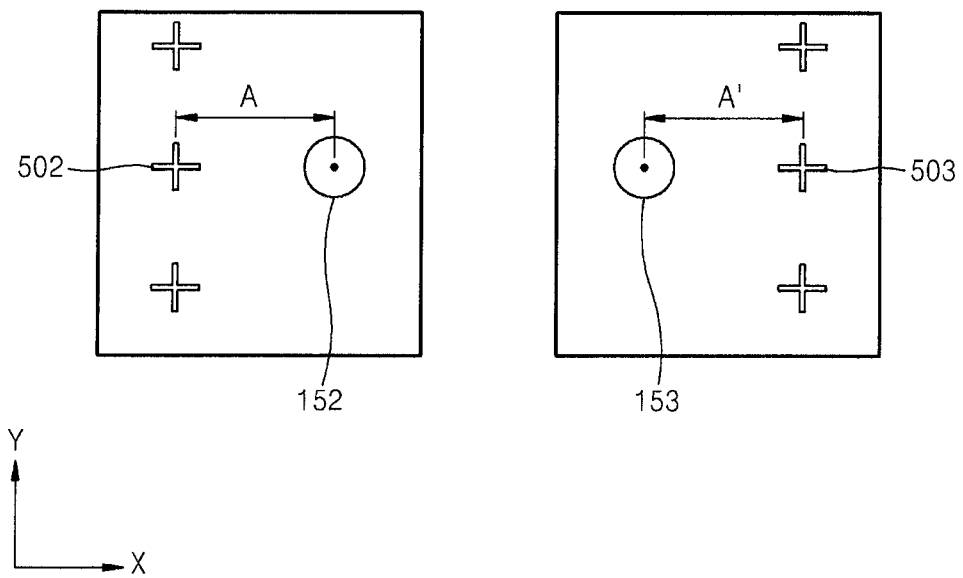
FIG. 9 illustrates an arrangement of the first and second alignment patterns and the first and second alignment marks when the substrate and the patterning slit sheet of FIG. 3 are appropriately aligned with each other in a first direction, according to an embodiment of the present invention.

FIG. 9 illustrates an arrangement of the first and second alignment patterns 502 and 503 and the first and second alignment marks 152 and 153 when the substrate 500 and the patterning slit sheet 150 of FIG. 3 are appropriately aligned with each other in a first direction, according to an embodiment of the present invention.

Referring to FIGS. 3 and 9, the first camera assembly 161 may be positioned over the first alignment mark 152, the second camera assembly 162 may be positioned over the second alignment mark 153, the first camera assembly 161 may capture an image of the first alignment pattern 502 and the first alignment mark 152 as illustrated in a left diagram of FIG. 9, and the second camera assembly 162 may capture an image of the second alignment pattern 503 and the second alignment mark 153 as illustrated in a right diagram of FIG. 9. If the substrate 500 and the patterning slit sheet 150 are appropriately aligned with each other, then a distance A between the first alignment pattern 502 and the first alignment mark 152 is equal to a distance A' between the second alignment pattern 503 and the second alignment mark 153.

Figure 10:
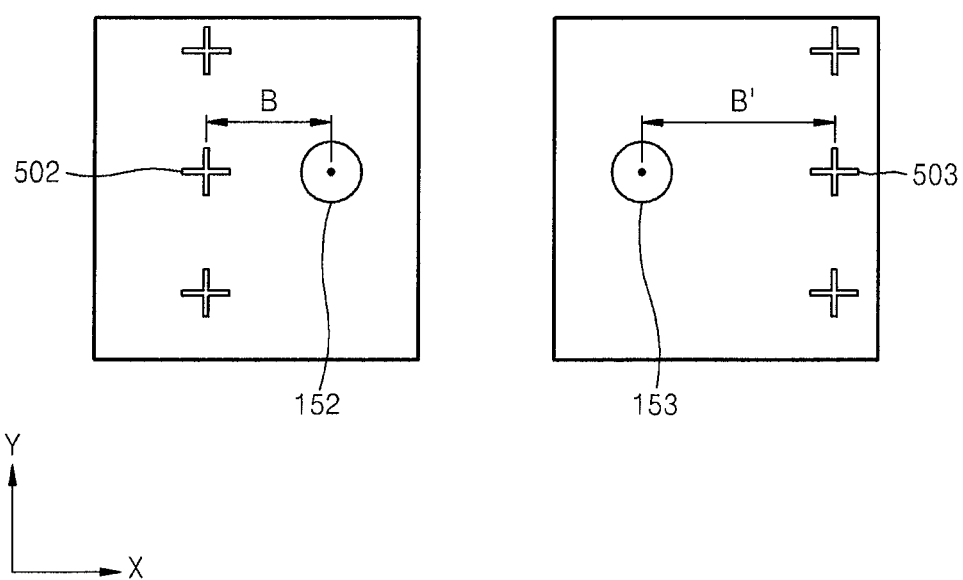
FIG. 10 illustrates an arrangement of the first and second alignment patterns 502 and 503 and the first and second alignment marks 152 and 153 when the substrate 500 of FIG. 3 is moved in an X-axis direction.

FIG. 10 illustrates an arrangement of the first and second alignment patterns 502 and 503 and the first and second alignment marks 152 and 153 when the substrate 500 of FIG. 3 is moved in an X-axis direction.

Referring to FIG. 10, when the substrate 500 is moved in the X-axis direction, a distance B between the first alignment pattern 502 and the first alignment mark 152 is less than a distance B' between the second alignment pattern 503 and the second alignment mark 153.

If the substrate 500 is moved in the X-axis direction, the controller 170 controls a driver (not shown) to move the substrate 500 by a distance (B'−B)/2 in the X-axis direction.

Figure 11:
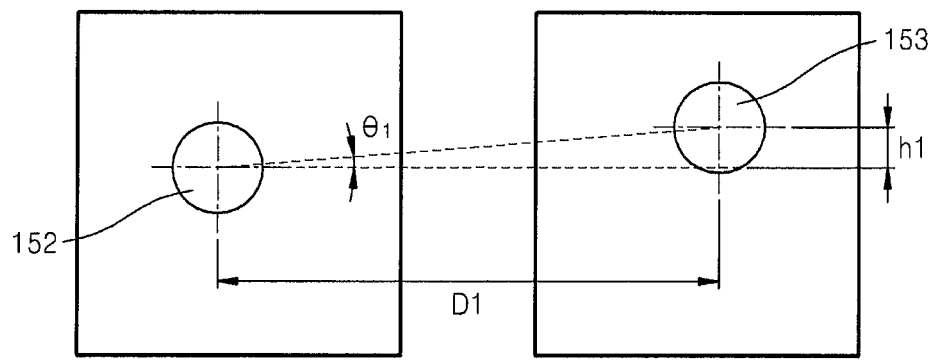
FIG. 11 illustrates an arrangement of the first and second alignment patterns and the first and second alignment marks when the pattering slit sheet of FIG. 3 is distorted in a direction indicated with an arrow 'θ'.
Figure 11:
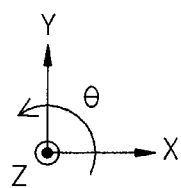

FIG. 11 illustrates an arrangement of the first and second alignment patterns and the first and second alignment marks when the pattering slit sheet of FIG. 3 is distorted in a direction indicated with an arrow 'θ'. If the patterning slit sheet 150 is distorted in the direction θ, it means that the patterning slit sheet 150 is moved counterclockwise (in the direction θ) or clockwise (in a negative direction θ) with respect to a Z-axis.

Referring to FIG. 11, if the pattering slit sheet 150 is distorted in the direction 'θ' (counterclockwise), then an image of the second alignment mark 153 captured by the second camera assembly 162 is located ahead of an image of the first alignment mark 152 captured by the first camera assembly 161, in the Y-axis direction. In other words, a Y-axis coordinate of the second alignment mark 153 is greater than that of the first alignment mark 152 by 'h1' with respect to the first alignment mark 152. A degree to which the patterning slit sheet 150 is distorted may be measured by calculating a distance D1 between the first and second alignment marks 152 and 153 and the difference h1 between the Y-axis coordinates of the first and second alignment marks 152 and 153. In detail, an angle θ1 at which the patterning slit sheet 150 is distorted is equal to Arctan(h1/D1). In this case, the controller 170 controls a driver (not shown) to move the patterning slit sheet 150 by an angle of Arctan(h1/D1) in the negative direction θ (clockwise).

Figure 12:
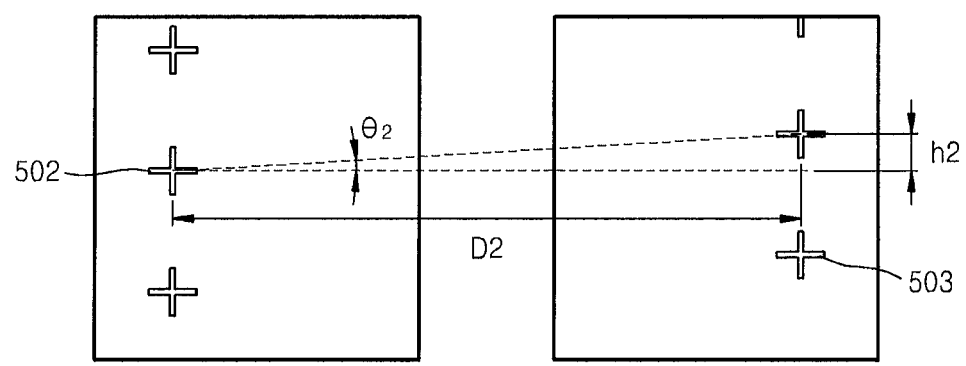
FIG. 12 illustrates an arrangement of the first and second alignment patterns 502 and 503 and the first and second alignment marks 152 and 153 when the substrate 500 of FIG. 3 is distorted in a direction indicated by an arrow 'θ', according to an embodiment of the present invention.
Figure 12:
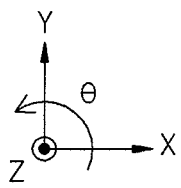

FIG. 12 illustrates an arrangement of the first and second alignment patterns 502 and 503 and the first and second alignment marks 152 and 153 when the substrate 500 of FIG. 3 is distorted in a direction indicated by an arrow 'θ', according to an embodiment of the present invention. If the substrate 500 is distorted in the direction θ, it means that the substrate 500 is moved counterclockwise (in the direction θ) or clockwise (in a negative direction θ) with respect to a Z-axis.

Referring to FIG. 12, if the substrate 500 is distorted in the direction θ (counterclockwise), then an image of the second alignment pattern 503 captured by the second camera assembly 162 is located ahead of an image of the first alignment pattern 502 captured by the first camera assembly 161, in the Y-axis direction. In other words, a Y-axis coordinate of the second alignment pattern 503 is greater than that of the first alignment pattern 502 by 'h2' with respect to the first alignment pattern 502. A degree to which the substrate 500 is distorted may be measured by calculating a distance D2 between the first and second alignment patterns 502 and 503 and the difference h2 between the Y-axis coordinates of the first and second alignment patterns 502 and 503. In detail, an angle θ1 at which the substrate 500 is distorted is equal to Arctan(h2/D2). In this case, the controller 170 controls a driver (not shown) to move the substrate 500 by an angle of Arctan(h2/D2) in the negative direction θ (clockwise).

As described above, the organic layer deposition apparatus 100 of FIG. 3 according to an embodiment of the present invention, is capable of controlling an alignment of the substrate 500 with the patterning slit sheet 150, not only when the substrate 500 is moved in a direction (second direction) perpendicular to a moving direction (first direction), but also when the substrate 500 is distorted in the moving direction (first direction).

Figure 13:
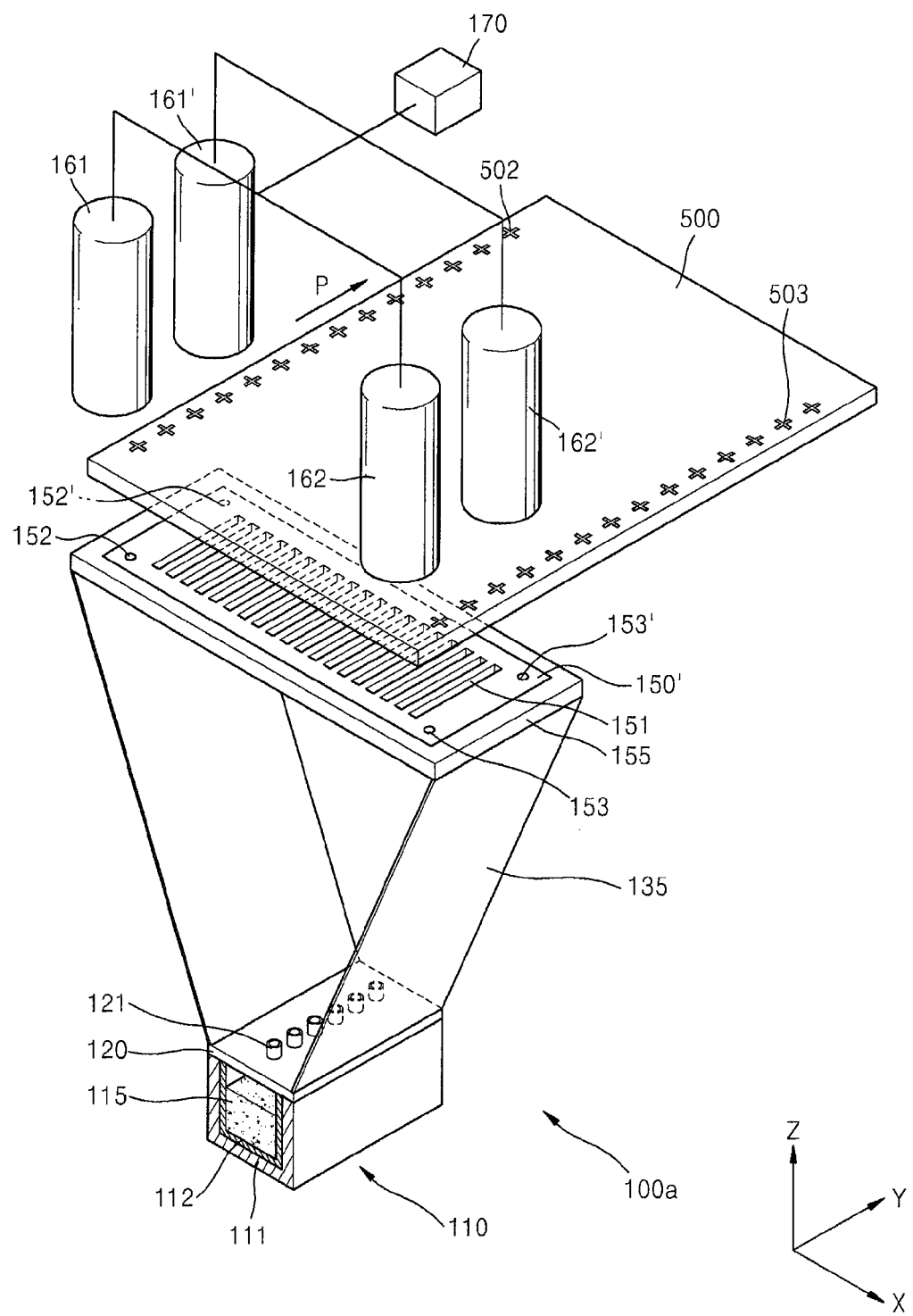
FIG. 13 is a schematic perspective view of an organic layer deposition apparatus 100a according to another embodiment of the present invention.

FIG. 13 is a schematic perspective view of an organic layer deposition apparatus 100a according to another embodiment of the present invention. Referring to FIG. 13, the organic layer deposition apparatus 100a further includes a third alignment mark 152', a fourth alignment mark 153', a third camera assembly 161', and a fourth camera assembly 162', compared to the organic layer deposition apparatus 100 of FIG. 3.

Specifically, a patterning slit sheet 150' of the organic layer deposition apparatus 100a may further include the third alignment mark 152' and the fourth alignment mark 153'. The third alignment mark 152' may be spaced apart from a first alignment mark 152 and the fourth alignment mark 153' may be spaced apart from a second alignment mark 153, in a first direction (Y-axis direction). A distance between the first and third alignment marks 152 and 152' may be equal to that between the second and fourth alignment marks 153 and 153'. The first and second alignment marks 152 and 153 are spaced apart from each other in a second direction (X-axis direction), and the third and fourth alignment marks 152' and 153' are also spaced apart from each other in the second direction (X-axis direction). A distance between the first and second alignment marks 152 and 153 may be equal to a distance between the third and fourth alignment marks 152' and 153'.

The first to fourth camera assemblies 161, 162, 161', and 162' may be located on a substrate 500 to respectively correspond to the first to fourth alignment marks 152, 153, 152', and 153'. Shooting speeds of the third and fourth camera assemblies 161' and 162' may be synchronized with a moving speed of the substrate 500. Thus, images of the first alignment pattern 502 captured by the third camera assembly 161' may have the same (or substantially the same) shape and size, and images of the second alignment pattern 503 captured by the fourth camera assembly 162' may have the same (or substantially the same) shape and size.

Figure 14:
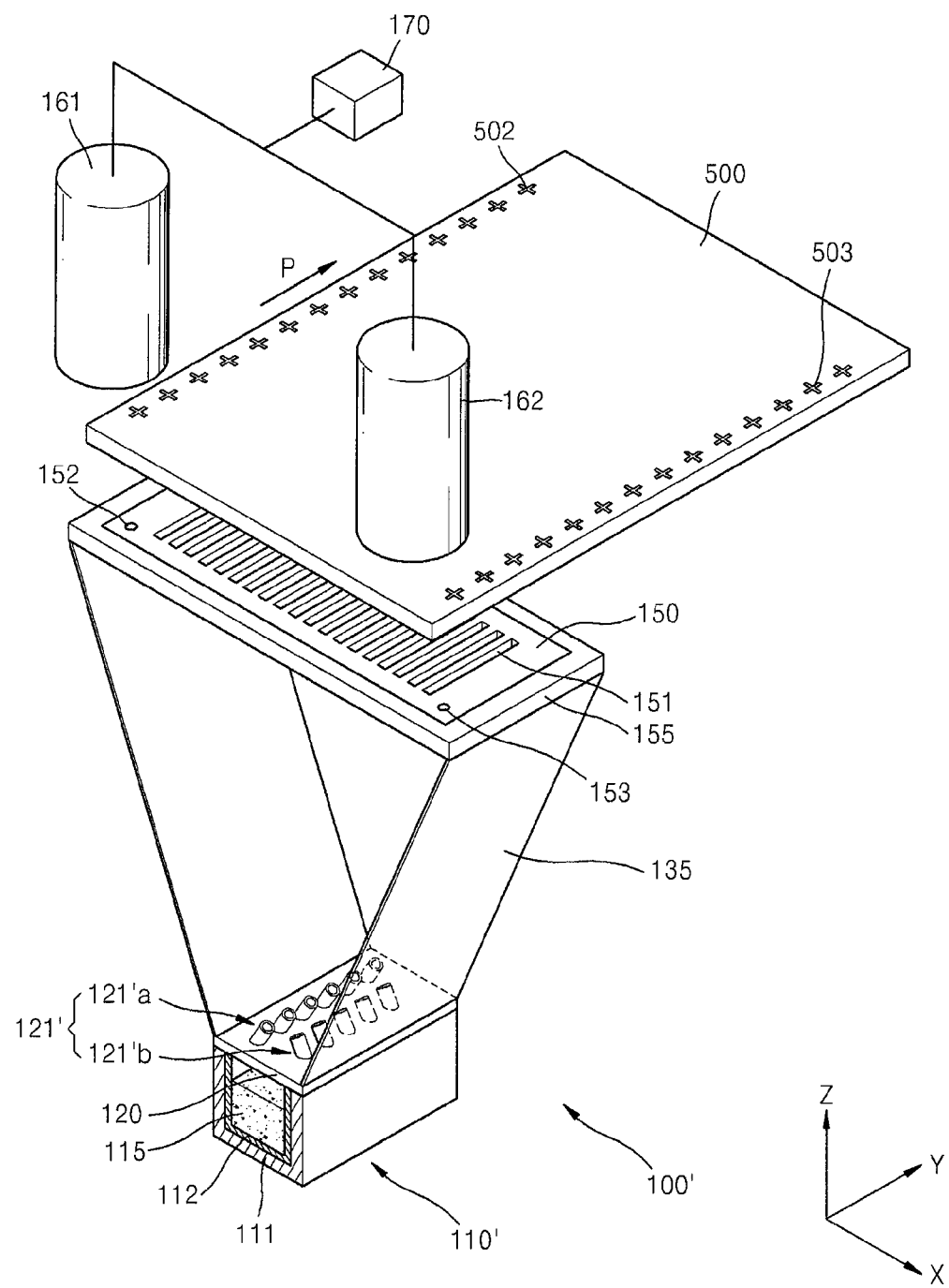
FIG. 14 is a schematic perspective view of an organic layer deposition apparatus according to another embodiment of the present invention.

FIG. 14 is a schematic perspective view of an organic layer deposition assembly 100' according to another embodiment of the present invention. Referring to FIG. 14, the organic layer deposition apparatus 100' includes a deposition source 110', a deposition source nozzle unit 120, and a patterning slit sheet 150. The deposition source 110' includes a crucible 112 filled with a deposition material 115, and a cooling block 111 that heats the crucible 112 to vaporize the deposition material 115 in the crucible 112 toward the deposition source nozzle unit 120. The deposition source nozzle unit 120, which has a planar shape, is located at a side of the deposition source 110'. The deposition source nozzle unit 120 includes a plurality of deposition source nozzles 121' arranged in a Y-axis direction. The patterning slit sheet 150 and a frame 155 are located between the deposition source 110' and a substrate 500. The patterning slit sheet 150 has a plurality of patterning slits 151 arranged in an X-axis direction. The deposition source 110' and the deposition source nozzle unit 120 may be connected to the patterning slit sheet 150 by connection members 135.

In the current embodiment, the plurality of deposition source nozzles 121' formed on the deposition source nozzle unit 120 are tilted at an angle (e.g., a predetermined angle), unlike the organic layer deposition apparatus 100 of FIG. 3. In particular, the deposition source nozzles 121' may include deposition source nozzles 121a' and 121b' arranged in respective rows. The deposition source nozzles 121a' and 121b' may be arranged in respective rows to alternate in a zigzag pattern. The deposition source nozzles 121a' and 121b' may be tilted at an angle (e.g., a predetermined angle) on an XZ plane.

In the current embodiment of the present invention, the deposition source nozzles 121a' and 121b' are arranged to tilt at an angle (e.g., a predetermined angle) to each other. The deposition source nozzles 121a' in a first row and the deposition source nozzles 121b' in a second row may tilt to face each other. That is, the deposition source nozzles 121a' of the first row in a left part of the deposition source nozzle unit 120 may tilt to face a right side portion of the patterning slit sheet 150, and the deposition source nozzles 121b' of the second row in a right part of the deposition source nozzle unit 121 may tilt to face a left side portion of the patterning slit sheet 150.

Due to the structure of the organic layer deposition apparatus 100' according to the current embodiment, the deposition of the deposition material 115 may be adjusted to lessen a thickness variation between the center and the end portions of an organic layer on the substrate 500 and improve thickness uniformity of the organic layer. Moreover, utilization efficiency of the deposition material 115 may also be improved.

Figure 15:
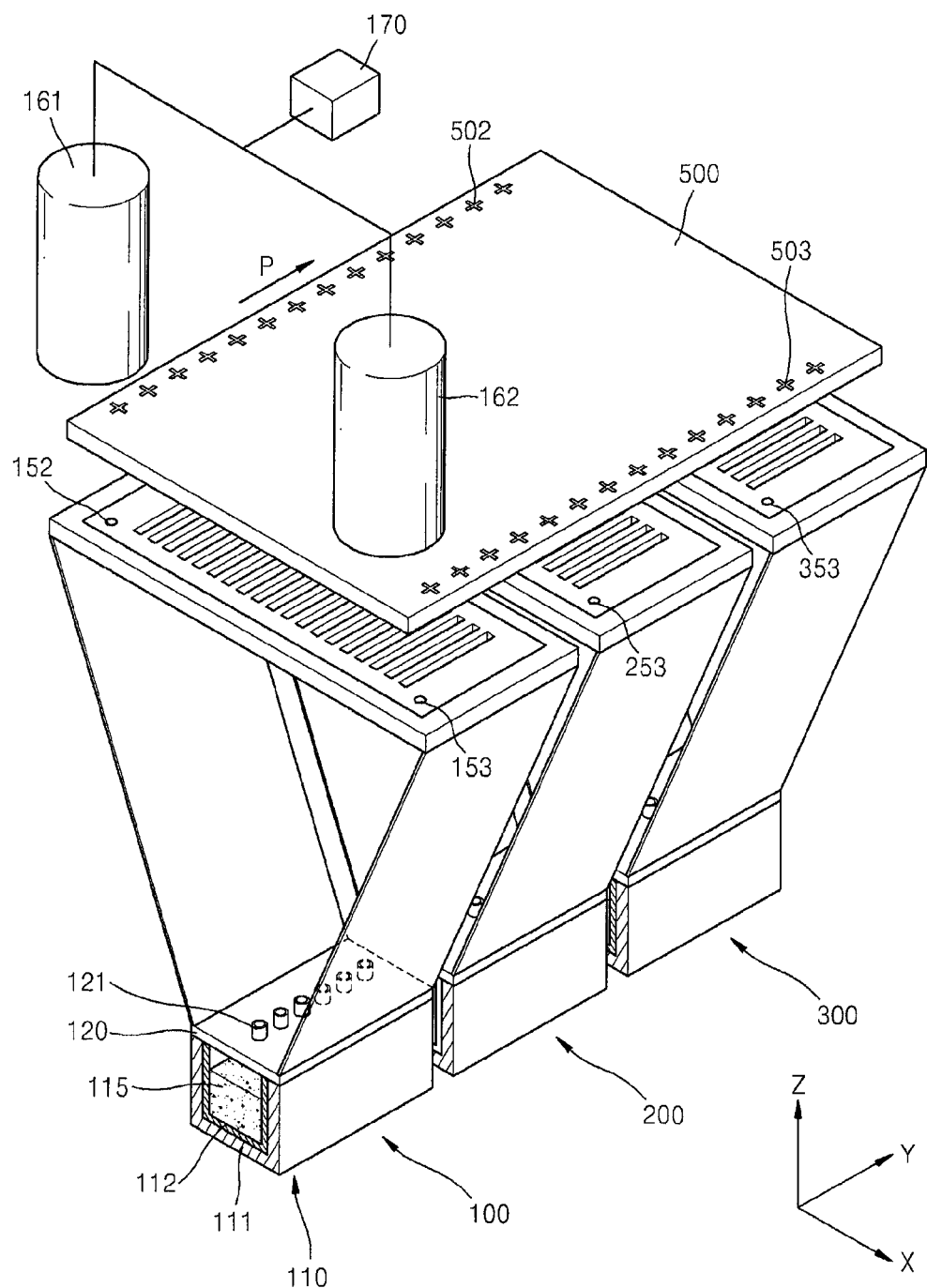
FIG. 15 is a schematic perspective view of an organic layer deposition apparatus according to another embodiment of the present invention.

FIG. 15 is a schematic perspective view of an organic layer deposition apparatus according to another embodiment of the present invention. Referring to FIG. 15, the organic layer deposition apparatus according to the current embodiment includes a plurality of organic layer deposition apparatuses, namely, first, second, and third organic layer deposition apparatuses 100, 200, and 300, each of which has the structure of the organic layer deposition apparatus 100 illustrated in FIGS. 4 through 6. In other words, the organic layer deposition apparatus according to the current embodiment may include a multi-deposition source unit including a plurality of deposition sources and that concurrently (e.g., simultaneously) discharges deposition materials for forming a red (R) emission layer, a green (G) emission layer, and a blue (B) emission layer.

In particular, the organic layer deposition apparatus according to the current embodiment includes the first organic layer deposition apparatus 100, the second organic layer deposition apparatus 200, and the third organic layer deposition apparatus 300. The first to third organic layer deposition apparatuses 100 to 300 have substantially the same structure as the organic layer deposition apparatus 100 described with reference to FIGS. 4 through 6, and thus a detailed description thereof will not be provided here.

Deposition sources of the first to third organic layer deposition apparatuses 100 to 300 may contain different deposition materials, respectively. For example, the first organic layer deposition apparatus 100 may contain a deposition material for forming the red (R) emission layer, the second organic layer deposition apparatus 200 may contain a deposition material for forming the green (G) emission layer, and the third organic layer deposition apparatus 300 may contain a deposition material for forming the blue (B) emission layer.

In other words, in a conventional method of manufacturing an organic light-emitting display device, a separate chamber and mask are used to form each color emission layer. However, when the organic layer deposition apparatus according to the current embodiment is used, the R emission layer, the G emission layer, and the B emission layer may be formed at the same time with a single multi-deposition source unit. Thus, a time needed to manufacture an organic light-emitting display device is reduced (e.g., sharply reduced). In addition, the organic light emitting display device may be manufactured with a reduced number of chambers, so that equipment costs may also be reduced (e.g., markedly reduced).

Although not illustrated, a patterning slit sheet of the first organic layer deposition apparatus 100, a patterning slit sheet of the second organic layer deposition apparatus 200, and a patterning slit sheet of the third organic layer deposition apparatus 300 may be arranged to be offset by a constant distance with respect to each other, in order for deposition regions corresponding to the patterning slit sheets not to overlap on a substrate 500. In other words, if the first organic layer deposition apparatus 100, the second organic layer deposition apparatus 200, and the third organic layer deposition apparatus 300 are used to deposit the R emission layer, the G emission layer, and the B emission layer, respectively, then patterning slits of the first organic layer deposition apparatus 100, patterning slits of the second organic layer deposition apparatus 200, and patterning slits of the third organic layer deposition apparatus 300 are arranged not to be aligned with respect to each other, thereby respectively forming the R emission layer, the G emission layer, and the B emission layer in different regions of the substrate 500.

In addition, the deposition materials used to form the R emission layer, the G emission layer, and the B emission layer may have different deposition temperatures. Therefore, the temperatures of the deposition sources of the respective first, second, and third organic layer deposition apparatuses 100, 200, and 300 may be set to be different.

Although FIG. 15 illustrates the three organic layer deposition apparatuses 100, 200, and 300, the present invention is not limited thereto. In other words, an organic layer deposition apparatus according to another embodiment of the present invention may include a plurality of organic layer deposition apparatuses, each of which contains a different deposition material. For example, an organic layer deposition apparatus according to another embodiment of the present invention may include five organic layer deposition apparatuses respectively containing materials for an R emission layer, a G emission layer, a B emission layer, an auxiliary R' layer of the R emission layer, and an auxiliary G' layer of the G emission layer.

As described above, a plurality of organic layers may be formed concurrently (e.g., at the same time) with a plurality of organic layer deposition apparatuses, and thus manufacturing yield and deposition efficiency may be improved. In addition, the overall manufacturing process may be simplified, and the manufacturing costs may be reduced.

Figure 16:
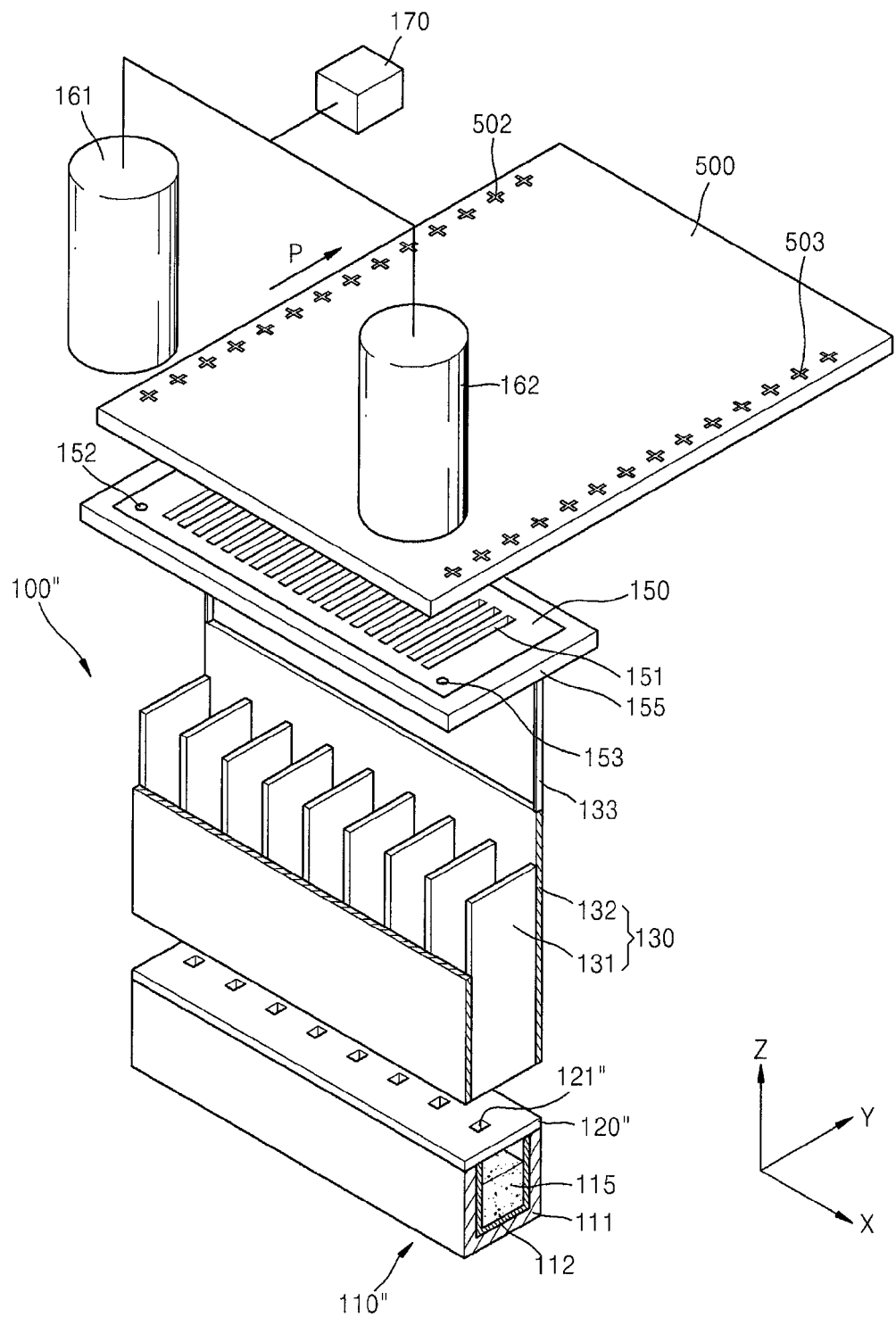
FIG. 16 is a schematic perspective cutaway view of an organic layer deposition apparatus according to another embodiment of the present invention.
Figure 17:
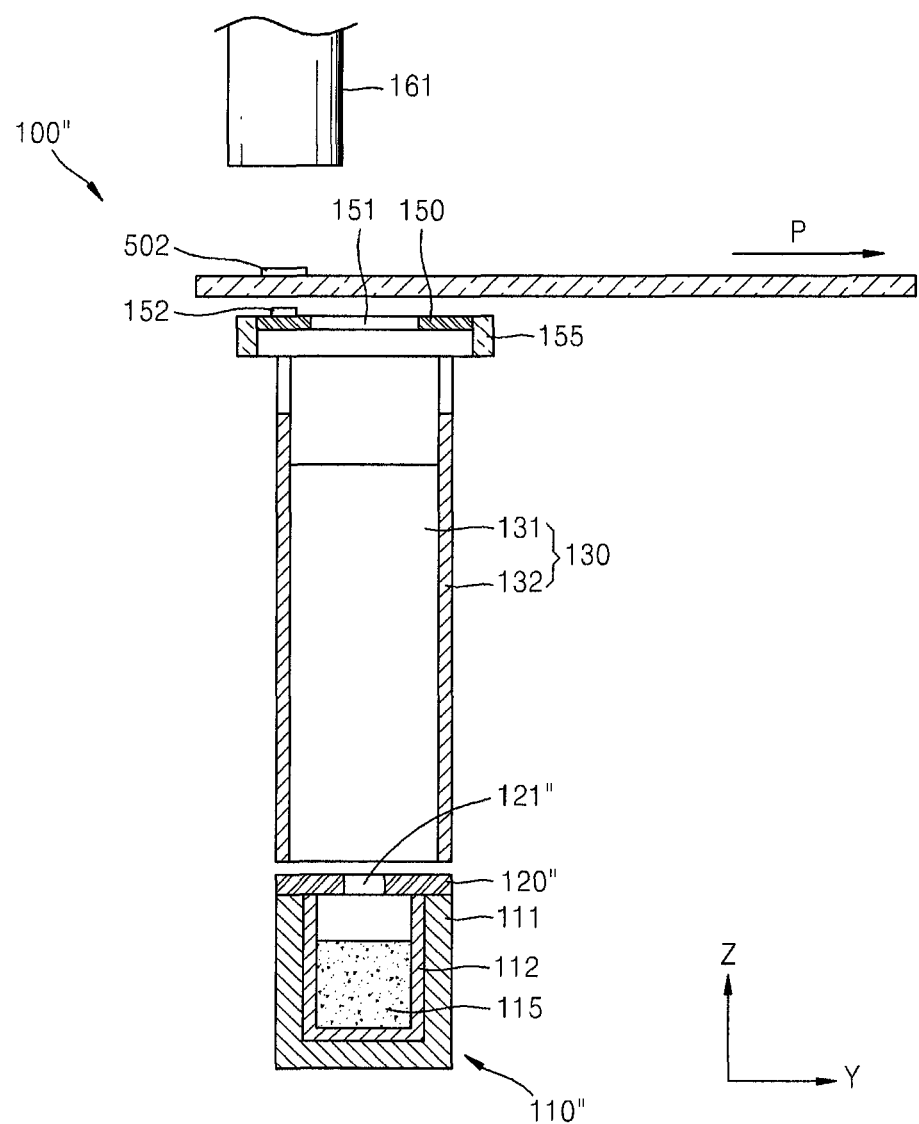
FIG. 17 is a schematic sectional view of the organic layer deposition apparatus of FIG. 16 taken in a plane parallel to the YZ plane.
Figure 18:
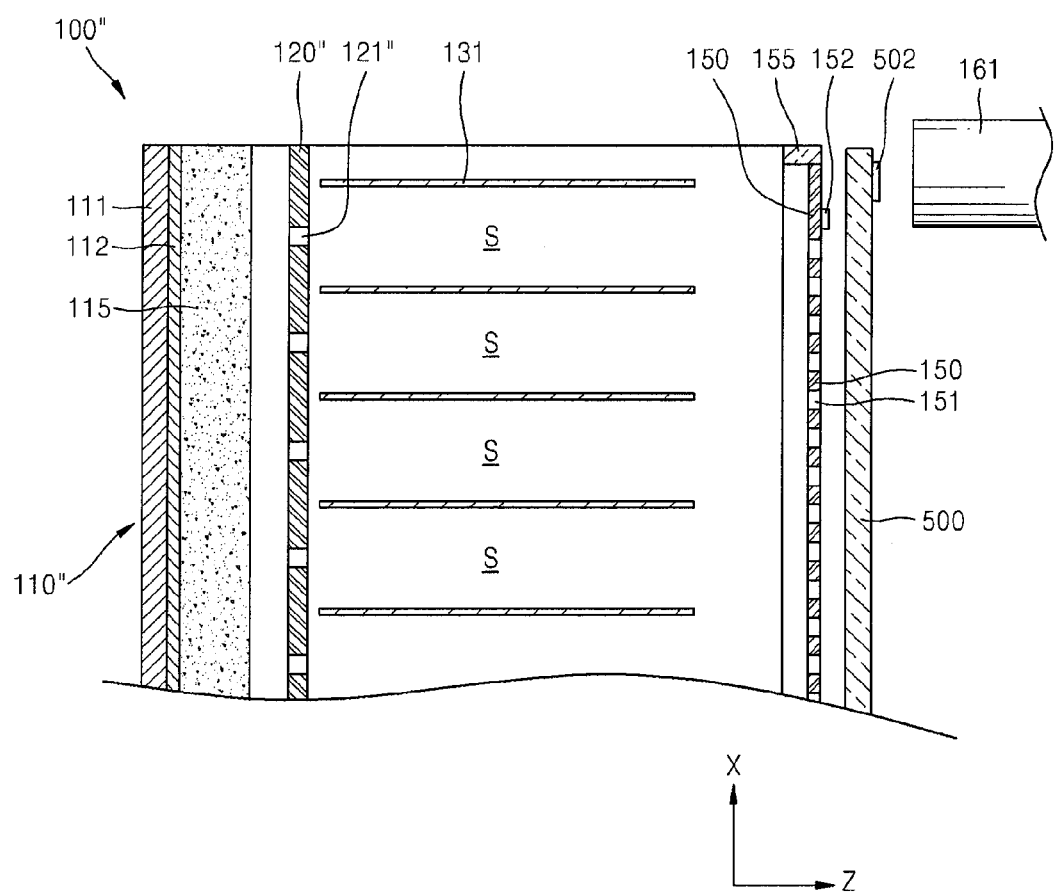
FIG. 18 is a schematic sectional view of the organic layer deposition apparatus of FIG. 16 taken in a plane parallel to the XZ plane.

FIG. 16 is a schematic perspective cutaway view of an organic layer deposition apparatus 100" according to another embodiment of the present invention. FIG. 17 is a schematic sectional view taken in a plane parallel to the YZ plane of the organic layer deposition apparatus 100" of FIG. 16. FIG. 18 is a schematic sectional view taken in a plane parallel to the XZ plane of the organic layer deposition apparatus 100" of FIG. 16.

Referring to FIGS. 16 through 18, the organic layer deposition apparatus 100" according to the current embodiment includes a deposition source 110", a deposition source nozzle unit 120", a barrier plate assembly 130, and a patterning slit sheet 150.

Although not illustrated in FIGS. 16 through 18 for convenience of explanation, all the components of the organic layer deposition apparatus 100" may be located within a chamber (not shown) that is maintained at an appropriate degree of vacuum. The chamber is maintained at an appropriate vacuum in order to allow a deposition material 115 to move in a substantially straight line through the organic layer deposition apparatus 100'''.

In the chamber, a substrate 500 that is a deposition target substrate is transferred by an electrostatic chuck 600. The substrate 500 may be a substrate for flat panel displays. A large substrate, such as a mother glass, for manufacturing a plurality of flat panel displays, may be used as the substrate 500. Other substrates may also be employed.

In an embodiment of the present invention, the substrate 500 may be moved relative to the organic layer deposition apparatus 100". For example, the substrate 500 may be moved in a direction of an arrow P, relative to the organic layer deposition apparatus 100".

Similar to the previous embodiment described above with reference to FIGS. 3 through 5, in the organic layer deposition apparatus 100" according to the current embodiment, the patterning slit sheet 150 may be smaller (e.g., significantly smaller) than an FMM used in a conventional deposition method. In other words, in the organic layer deposition apparatus 100", deposition is continuously performed, for example, in a scanning manner while the substrate 500 is moved in the Y-axis direction. Thus, a length of the patterning slit sheet 150 in the Y-axis direction may be less (e.g., significantly less) than a length of the substrate 500, provided that a width of the patterning slit sheet 150 in the X-axis direction and a width of the substrate 500 in the X-axis direction are substantially equal to each other. However, even when the width of the patterning slit sheet 150 in the X-axis direction is less than the width of the substrate 500 in the X-axis direction, deposition may be performed on the entire substrate 500 in a scanning manner while the substrate 500 or the organic layer deposition apparatus 100" is moved relative to each other.

As described above, since the patterning slit sheet 150 may be formed to be smaller (e.g., significantly smaller) than an FMM used in the conventional deposition method, it is relatively easy to manufacture the patterning slit sheet 150 used in embodiments of the present invention. In other words, using the patterning slit sheet 150, which is smaller than an FMM used in the conventional deposition method, is more convenient in all processes, including etching and other subsequent processes, such as precise extension, welding, moving, and cleaning processes, compared to the conventional deposition method using the larger FMM. This may be more advantageous for a relatively large display device.

The deposition source 110" that contains and heats a deposition material 115 is located at an opposite side of the chamber to a side at which the substrate 500 is located.

The deposition source 110" includes a crucible 112 filled with the deposition material 115, and a cooling block 112 surrounding the crucible 112. The cooling block 111 prevents or reduces radiation of heat from the crucible 112 outside, for example, into the chamber. The cooling block 111 may include a heater (not shown) that heats the crucible 112.

The deposition source nozzle unit 120" is located at a side of the deposition source 110", and in particular, at the side of the deposition source 110" facing the substrate 500. The deposition source nozzle unit 120" includes a plurality of deposition source nozzles 121" that may be arranged at equal intervals along the X-axis direction. The deposition material 115 that is vaporized in the deposition source 110" passes through the deposition source nozzles 121" of the deposition source nozzle unit 120" towards the substrate 500 that is a deposition target.

The barrier plate assembly 130 is located at a side of the deposition source nozzle unit 120". The barrier plate assembly 130 includes a plurality of barrier plates 131, and a barrier plate frame 132 that covers sides of the barrier plates 132. The plurality of barrier plates 131 may be arranged parallel to each other at equal intervals along the X-axis direction. In addition, each of the barrier plates 131 may be arranged parallel to an YZ plane in FIG. 16, and may have a rectangular shape. The plurality of barrier plates 131 arranged as described above partition a deposition space between the deposition source nozzle unit 120" and the patterning slit sheet 150 into a plurality of sub-deposition spaces S. In the organic layer deposition apparatus 100" according to the current embodiment, as illustrated in FIG. 17, the deposition space is divided by the barrier plates 131 into the sub-deposition spaces S that respectively correspond to the deposition source nozzles 121" through which the deposition material 115 is discharged.

The barrier plates 131 may be respectively located between adjacent deposition source nozzles 121". In other words, each of the deposition source nozzles 121" may be located between two adjacent barrier plates 131. Each of the deposition source nozzles 121" may be located at the midpoint between two adjacent barrier plates 131. However, the present invention is not limited to this structure. For example, a plurality of deposition source nozzles 121" may be located between two adjacent barrier plates 131. In this case, the plurality of deposition source nozzles 121" may also be respectively located at the midpoint between two adjacent barrier plates 131.

As described above, since the barrier plates 131 partition the space between the deposition source nozzle unit 120" and the patterning slit sheet 150 into the plurality of sub-deposition spaces S, the deposition material 115 discharged through each of the deposition source nozzles 121" is not mixed with the deposition material 115 discharged through the other deposition source nozzles 121", and passes through patterning slits 151 of the patterning slit sheet 150 so as to be deposited on the substrate 500. In other words, the barrier plates 131 guide the deposition material 115, which is discharged through the deposition source nozzles 121", to move straight, i.e., to flow in the Z-axis direction.

As described above, the deposition material 115 is forced to move straight by installing the barrier plates 131, so that a smaller shadow zone may be formed on the substrate 500 compared to a case where no barrier plates are installed. Thus, the organic layer deposition apparatus 100" and the substrate 500 may be separated from each other by a distance (e.g., predetermined distance). This will be described later in detail.

The barrier plate frame 132, which covers sides of the barrier plates 131, maintains the positions of the barrier plates 131, and guides the deposition material 115, which is discharged through the deposition source nozzles 121", not to flow in the Y-axis direction.

The deposition source nozzle unit 120" and the barrier plate assembly 130 may be spaced apart from each other by a distance (e.g., a predetermined distance). This may prevent heat radiated from the deposition source unit 110" from being conducted to the barrier plate assembly 130. However, aspects of the present invention are not limited to this. For example, when an appropriate heat insulator (not shown) is positioned between the deposition source nozzle unit 120" and the barrier plate assembly 130, the deposition source nozzle unit 120" and the barrier plate assembly 130 may be bound together with the heat insulator therebetween.

In addition, the barrier plate assembly 130 may be constructed to be detachable from the organic layer deposition apparatus 100". In the organic layer deposition apparatus 100" according to the current embodiment, the deposition space is enclosed by using the barrier plate assembly 130, so that the deposition material 115 that remains undeposited is mostly located within the barrier plate assembly 130. Thus, since the barrier plate assembly 130 is constructed to be detachable from the organic layer deposition apparatus 100", when a large amount of the deposition material 115 lies in the barrier plate assembly 130 after a long deposition process, the barrier plate assembly 130 may be detached from the organic layer deposition apparatus 100" and then placed in a separate deposition material recycling apparatus in order to recover the deposition material 115. Due to the structure of the organic layer deposition apparatus 100" according to the present embodiment, a reuse rate of the deposition material 115 may be increased, so that the deposition efficiency may be improved, and thus the manufacturing costs may be reduced.

The patterning slit sheet 150 and a frame 155 are disposed between the deposition source 110" and the substrate 500. The shape of the frame 155 may be similar to a window frame. The patterning slit sheet 150 is bound inside the frame 155.

The patterning slit sheet 150 has the plurality of patterning slits 151 arranged in the X-axis direction. The patterning slits 151 extend in the Y-axis direction. The deposition material 115 that has been vaporized in the deposition source 110" and passed through the deposition source nozzle 121", passes through the patterning slits 151 towards the substrate 500.

The patterning slit sheet 150 may be formed of a metal thin film. The patterning slit sheet 150 is fixed to the frame 155 such that a tensile force is exerted thereon. In other words, the frame 150 may be pulled (e.g., stretched) in one or both opposite directions by the frame 155. The patterning slits 150 may be formed by etching the patterning slit sheet 150 to a stripe pattern.

In the organic layer deposition apparatus 100" according to the current embodiment, the total number of patterning slits 151 may be greater than the total number of deposition source nozzles 121". In addition, there may be a greater number of patterning slits 151 located between two adjacent barrier plates 131 than deposition source nozzles 121" located between two adjacent barrier plates 131. The number of patterning slits 151 may be equal to the number of deposition patterns to be formed on the substrate 500.

The barrier plate assembly 130 and the patterning slit sheet 150 may be spaced apart from each other by a distance (e.g., a predetermined distance), and may be connected by second connection members 133. The temperature of the barrier plate assembly 130 may increase to 100° C. or higher due to the deposition source 110" whose temperature is high. Thus, in order to prevent the heat of the barrier plate assembly 130 from being conducted to the patterning slit sheet 150, the barrier plate assembly 130 and the patterning slit sheet 150 are separated from each other by a distance (e.g., a predetermined distance).

As described above, the organic layer deposition apparatus 100" according to the current embodiment performs deposition while being moved relative to the substrate 500. In order to move the organic layer deposition apparatus 100" relative to the substrate 500, the patterning slit sheet 150 is spaced apart from the substrate 500 by a distance (e.g., a predetermined distance). In addition, in order to prevent the formation of a relatively large shadow zone on the substrate 500 when the patterning slit sheet 150 and the substrate 500 are spaced apart from each other, the barrier plates 131 are arranged between the deposition source nozzle unit 120" and the patterning slit sheet 150 to force the deposition material 115 to move in a straight direction. Thus, the size of the shadow zone that may be formed on the substrate 500 is reduced (e.g., sharply reduced).

In a typical deposition method using an FMM, deposition is performed with the FMM in close contact with a substrate in order to reduce or prevent formation of a shadow zone on the substrate. However, when the FMM is used in close contact with the substrate, the contact may cause defects, such as scratches on patterns formed on the substrate. In addition, in the typical deposition method, the size of the mask is the same as the size of the substrate since the mask cannot be moved relative to the substrate. Thus, the size of the mask becomes increased as display devices become larger. However, it is not easy to manufacture such a large mask.

In order to overcome this problem, in the organic layer deposition apparatus 100" according to the current embodiment, the patterning slit sheet 150 is spaced apart from the substrate 500 by a distance (e.g., a predetermined distance). This may be facilitated by installing the barrier plates 131 to reduce the size of the shadow zone formed on the substrate 500.

As described above, when the patterning slit sheet 150 is manufactured to be smaller than the substrate 500, the patterning slit sheet 150 may be moved relative to the substrate 500 during deposition. Thus, it is no longer necessary to manufacture a large FMM as used in the conventional deposition method. In addition, since the substrate 500 and the patterning slit sheet 150 are separated from each other, defects caused due to contact therebetween may be prevented. In addition, since it is unnecessary to contact the substrate 500 with the patterning slit sheet 150 during a deposition process, the manufacturing speed may be improved.

Figure 19:
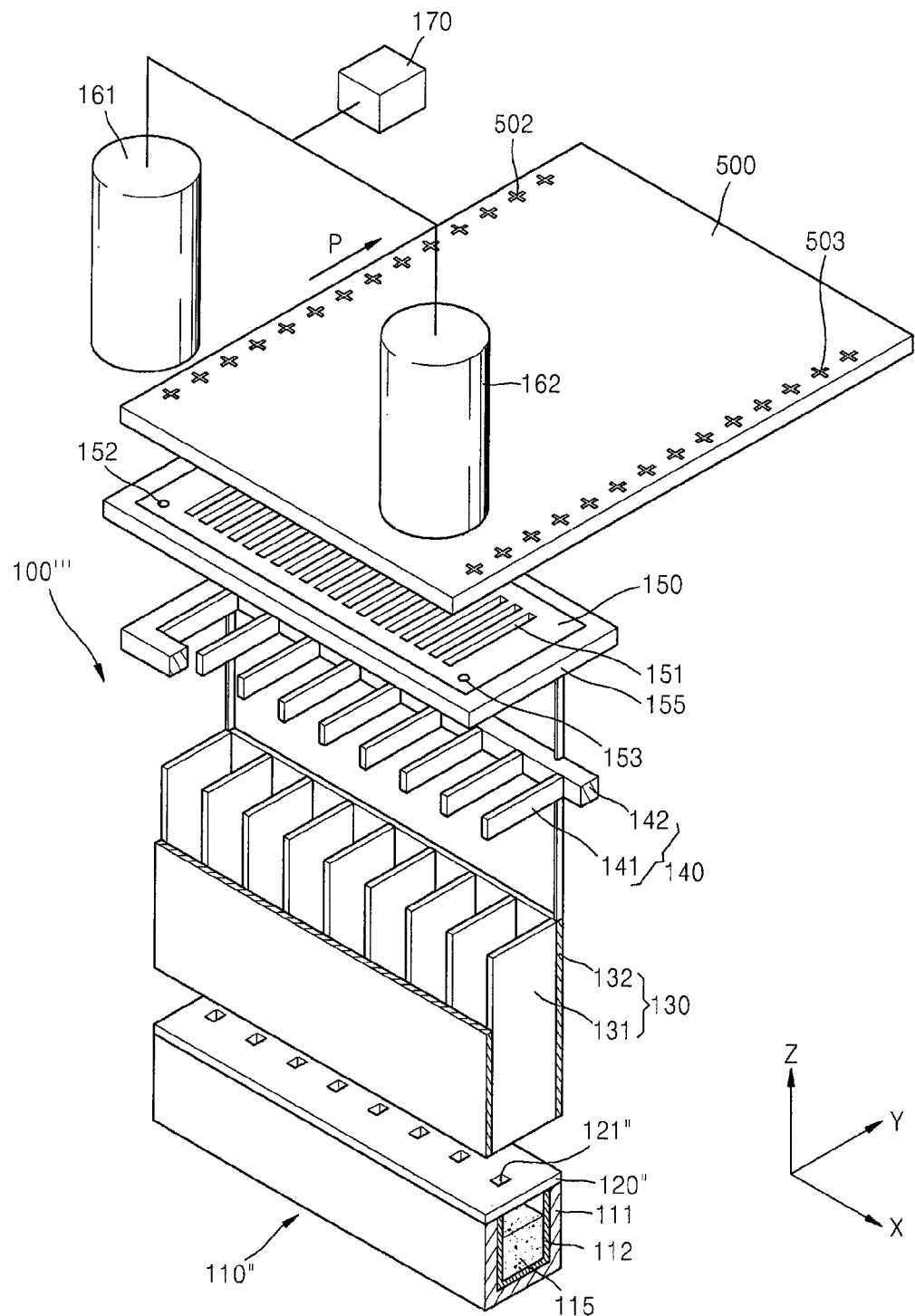
FIG. 19 is a schematic perspective cutaway view of an organic layer deposition apparatus according to another embodiment of the present invention.

FIG. 19 is a schematic perspective view of an organic layer deposition apparatus 100''' according to another embodiment of the present invention.

Referring to FIG. 19, the organic layer deposition apparatus 100' according to the current embodiment includes a deposition source 110", a deposition source nozzle unit 120", a first barrier plate assembly 130, a second barrier plate assembly 140, and a patterning slit sheet 150.

Although not illustrated in FIG. 19 for convenience of explanation, all the components of the organic layer deposition apparatus 100''' may be located within a chamber (not shown) that is maintained at an appropriate degree of vacuum.

The chamber is maintained at an appropriate vacuum in order to allow a deposition material 115 to move in a substantially straight line through the organic layer deposition apparatus 100'''.

The substrate 500 which is a deposition target substrate is located in the chamber. The deposition source 110'' that contains and heats the deposition material 115 is located at an opposite side of the chamber to a side at which the substrate 500 is located.

Structures of the deposition source 110'' and the patterning slit sheet 150 are substantially the same as those in the embodiment described with reference to FIG. 16, and thus a detailed description thereof will not be provided here. The first barrier plate assembly 130 is also substantially the same as the barrier plate assembly 130 of the embodiment described with reference to FIG. 16, and thus a detailed description thereof will not be provided here.

In the current embodiment, the second barrier plate assembly 140 is located at a side of the first barrier plate assembly 130. The second barrier plate assembly 140 includes a plurality of second barrier plates 141, and a second barrier plate frame 141 that covers sides of the second barrier plates 142.

The plurality of second barrier plates 141 may be arranged parallel to each other at equal intervals along the X-axis direction. In addition, each of the second barrier plates 141 may be formed to extend in the YZ plane in FIG. 19, i.e., perpendicular to the X-axis direction.

The plurality of first barrier plates 131 and the plurality of second barrier plates 141 arranged as described above, partition a deposition space between the deposition source nozzle unit 120'' and the patterning slit sheet 150. The deposition space is divided by the first barrier plates 131 and the second barrier plates 141 into sub-deposition spaces that respectively correspond to the deposition source nozzles 121'' through which the deposition material 115 is discharged.

The second barrier plates 141 may be positioned to correspond respectively to the first barrier plates 131. In other words, the second barrier plates 141 may be aligned with the first barrier plates 131, respectively. Each pair of the corresponding first and second barrier plates 131 and 141 may be located on the same plane. Although the first barrier plates 131 and the second barrier plates 141 are respectively illustrated as having the same width in the X-axis direction, aspects of the present invention are not limited thereto. In other words, the second barrier plates 141, which should be accurately aligned with the patterning slits 151, may be formed to be relatively thin, whereas the first barrier plates 131, which may not need to be precisely aligned with the patterning slits 151, may be formed to be relatively thick. This makes it easier to manufacture the organic layer deposition apparatus 100'''.

As illustrated in FIG. 1, a plurality of the organic layer deposition apparatuses 100' may be successively located in the chamber. In this case, the plurality of organic layer deposition apparatuses 100''' may be used to deposit different deposition materials, respectively. For example, the plurality of organic layer deposition apparatuses 100''' may have different patterning slit patterns, so that pixels of different colors, for example, red, green, and blue, may be concurrently (e.g., simultaneously) defined through a deposition process.

Figure 20:
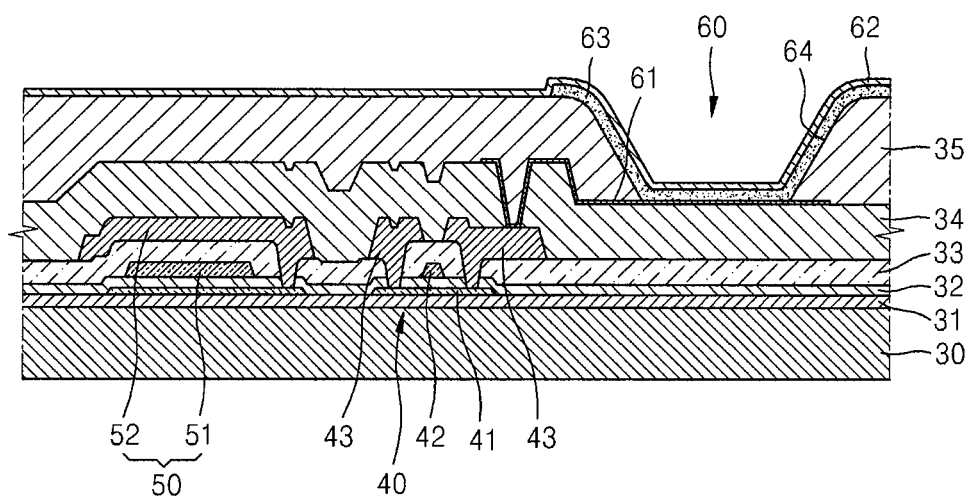
FIG. 20 is a cross-sectional view of an organic light-emitting display device manufactured by using an organic layer deposition apparatus, according to an embodiment of the present invention.

FIG. 20 is a cross-sectional view of an active matrix organic light-emitting display device fabricated by using an organic layer deposition apparatus, according to an embodiment of the present invention.

Referring to FIG. 20, the active matrix organic light-emitting display device is formed on a substrate 30. The substrate 30 may be formed of a transparent material, for example, glass, plastic, or metal. An insulating layer 31, such as a buffer layer, is formed on an entire surface of the substrate 30.

A thin-film transistor (TFT) 40, a capacitor 50, and an organic light-emitting diode (OLED) 60 are disposed on the insulating layer 31, as illustrated in FIG. 19.

A semiconductor active layer 41 is formed on an upper surface of the insulating layer 31 (e.g., formed in a predetermined pattern). A gate insulating layer 32 is formed to cover the semiconductor active layer 41. The semiconductor active layer 41 may include a p-type or n-type semiconductor material.

A first capacitor electrode 51 of the capacitor 50, and a gate electrode 42 of the TFT 40 are formed on upper portions of the gate insulating layer 32 corresponding to the semiconductor active layer 41. An interlayer insulating layer 33 is formed to cover the first capacitor electrode 51 and the gate electrode 42. Then, the interlayer insulating layer 33 and the gate insulating layer 32 are etched by, for example, dry etching, to form a contact hole exposing parts of the semiconductor active layer 41.

Then, a second capacitor electrode 52 and a source/drain electrode 43 are formed on the interlayer insulating layer 33. The source/drain electrode 43 contacts the semiconductor active layer 41 through the contact hole. A passivation layer 34 is formed to cover the second capacitor 52 and the source/drain electrode 43, and is etched to expose a part of the drain electrode 43. An insulating layer (not shown) may be further formed on the passivation layer 34 so as to planarize the passivation layer 34.

In addition, the OLED 60 displays image information (e.g., predetermined image information) by emitting red, green, or blue light as current flows therethrough. The OLED 60 includes a first electrode 61 located on the passivation layer 34. The first electrode 61 is electrically connected to the drain electrode 43 of the TFT 40.

A pixel defining layer 35 is formed to cover the first electrode 61. An opening 64 is formed in the pixel defining layer 35, and an organic emission layer 63 is formed in a region defined by the opening 64. A second electrode 62 is formed on the organic emission layer 63.

The pixel defining layer 35, which defines individual pixels, is formed of an organic material. The pixel defining layer 35 also planarizes the surface of a region of the substrate 30 in which the first electrode 61 is formed, and in particular, the surface of the passivation layer 34.

The first electrode 61 and the second electrode 62 are insulated from each other, and respectively apply voltages of opposite polarities to the organic emission layer 63 to induce light emission.

The organic emission layer 63 may be formed of a low-molecular weight organic material or a high-molecular weight organic material. When a low-molecular weight organic material is used, the organic emission layer 63 may have a single or multi-layer structure including at least one selected from the group consisting of a hole injection layer (HIL), a hole transport layer (HTL), an emission layer (EML), an electron transport layer (ETL), and an electron injection layer (EIL). Examples of available organic materials may include copper phthalocyanine (CuPc), N,N'-di(naphthalene-1-yl)-N,N'-diphenyl-benzidine (NPB), tris-8-hydroxyquinoline aluminum (Alq3), and the like. Such a low-molecular weight organic material may be deposited using vacuum deposition by using an organic layer deposition apparatus, such as those illustrated in FIGS. 1 to 19. Further, the organic layer deposition assemblies 100, 200, 300, and/or 400 of FIGS. 1 and 2 can be replaced by any suitable one of the organic layer deposition apparatus 100 of FIGS. 3-5, the organic layer deposition apparatus 100a of FIG. 13, the organic layer deposition apparatus 100' of FIG. 14, the organic layer deposition apparatus 100, 200, 300 of FIG. 15, the organic layer deposition apparatus 100" of FIGS. 16-18, or the organic layer deposition apparatus 100''' of FIG. 19.

After the organic emission layer 63 is formed, the second electrode 62 may be formed by the same deposition method as used to form the organic emission layer 63.

The first electrode 61 may function as an anode and the second electrode 62 may function as a cathode, or vice versa. The first electrode 61 may be patterned to correspond to individual pixel regions, and the second electrode 62 may be formed to cover all the pixels.

The first electrode 61 may be formed as a transparent electrode or a reflective electrode. Such a transparent electrode may be formed of indium tin oxide (ITO), indium zinc oxide (IZO), zinc oxide (ZnO), or indium oxide ($In_2O_3$). Such a reflective electrode may be formed by forming a reflective layer from silver (Ag), magnesium (Mg), aluminum (Al), platinum (Pt), palladium (Pd), gold (Au), nickel (Ni), neodymium (Nd), iridium (Ir), chromium (Cr) or a compound thereof, and forming a layer of ITO, IZO, ZnO, or $In_2O_3$ on the reflective layer. The first electrode 61 may be formed by forming a layer by, for example, sputtering, and then patterning the layer by, for example, photolithography.

The second electrode 62 may also be formed as a transparent electrode or a reflective electrode. When the second electrode 62 is formed as a transparent electrode, the second electrode 62 functions as a cathode. To this end, such a transparent electrode may be formed by depositing a metal having a low work function, such as lithium (Li), calcium (Ca), lithium fluoride/calcium (LiF/Ca), lithium fluoride/aluminum (LiF/Al), aluminum (Al), silver (Ag), magnesium (Mg), or a compound thereof on a surface of the intermediate layer 63 and forming an auxiliary electrode layer or a bus electrode line thereon from ITO, IZO, ZnO, $In_2O_3$, or the like. When the second electrode 62 is formed as a reflective electrode, a reflective electrode may be formed by depositing Li, Ca, LiF/Ca, LiF/Al, Al, Ag, Mg, or a compound thereof on the entire surface of the organic emission layer 63. The second electrode 62 may be formed by using the same deposition method as used to form the organic emission layer 63 described above.

The organic layer deposition apparatuses according to the embodiments of the present invention described above may be applied to form an organic layer or an inorganic layer of an organic TFT, and to form layers from various materials.

As described above, the organic layer deposition apparatus according to aspects of the present invention may be easily manufactured and may be simply applied to the manufacture of large-sized display devices on a mass scale. The organic layer deposition apparatus may improve manufacturing yield and deposition efficiency, may allow a deposition material to be reused, and may allow a substrate and the organic layer deposition apparatus to be precisely aligned with each other.

While the present invention has been particularly shown and described with reference to exemplary embodiments thereof, it will be understood by those of ordinary skill in the art that various changes in form and details may be made therein without departing from the spirit and scope of the present invention as defined by the following claims and their equivalents.

What is claimed is:

1. A method of manufacturing an organic light-emitting display device utilizing an organic layer deposition apparatus comprising a deposition source configured to discharge a deposition material; a deposition source nozzle unit located at a side of the deposition source and comprising a plurality of deposition source nozzles arranged in a first direction; a patterning slit sheet located opposite to the deposition source nozzle unit and having a plurality of patterning slits arranged in a second direction perpendicular to the first direction and comprising a first alignment mark and a second alignment mark located apart from each other; and a first camera assembly and a second camera assembly, the method comprising:
   mounting a substrate in a chamber, the substrate comprising a first alignment pattern and a second alignment pattern located apart from each other, and the patterning slit sheet being smaller in at least one of the first and second directions that the substrate; and
   performing deposition by discharging the deposition material from the deposition source through the patterning slit sheet toward the substrate while the substrate moves relative to the deposition source in the first direction, and while photographing the first alignment mark and the first alignment pattern utilizing the first camera assembly, and photographing the second alignment mark and the second alignment pattern utilizing the second camera assembly,
   wherein a moving speed of the substrate is synchronized with shooting speeds of the first and second camera assemblies so that when the substrate is appropriately aligned with the patterning slit sheet, images of the first alignment pattern captured by the first camera assembly are substantially the same as each other, and images of the second alignment pattern captured by the second camera assembly are substantially the same as each other.

2. The method of claim 1, wherein the deposition source, the deposition source nozzle unit, and the patterning slit sheet are integrally formed as one body.

3. The method of claim 1, wherein the deposition source and the deposition source nozzle unit, and the patterning slit sheet are integrally connected as one body by connection members for guiding movement of the deposition material.

4. The method of claim 3, wherein the connection members seal a space between the deposition source, the deposition source nozzle unit, and the patterning slit sheet.

5. The method of claim 1, wherein the first alignment pattern comprises a plurality of first marks arranged along the first direction,
   the second alignment pattern comprises a plurality of second marks arranged along the first direction, and
   the first alignment pattern and the second alignment pattern are spaced apart from each other in the second direction.

6. The method of claim 5, wherein shapes and sizes of the plurality of first marks and the plurality of second marks are the same.

7. The method of claim 5, wherein distances between the plurality of first marks are substantially equal to distances between the plurality of second marks.

8. The method of claim 5, wherein each of the plurality of first marks or the plurality of second marks has a polygonal shape.

9. The method of claim 8, wherein each of the plurality of first marks or the plurality of second marks has a triangular shape.

10. The method of claim 1, wherein the first alignment pattern and the second alignment pattern have a sawtooth shape.

11. The method of claim 1, further comprising moving the substrate at a substantially uniform velocity in the first direction, photographing the first alignment pattern and the second alignment pattern at time intervals utilizing the first and second camera assemblies respectively, wherein the first camera assembly captures a number of images each containing the first alignment patterns, and the second camera assembly captures a number of images each containing the second alignment patterns, which is equal to the number of images each containing the first alignment pattern.

12. The method of claim 1, wherein the first camera assembly and the second camera assembly are positioned over the substrate to respectively correspond to the first alignment mark and the second alignment mark.

13. The method of claim 1, further comprising determining a degree to which the substrate and the patterning slit sheet are aligned with each other utilizing a controller, based on information captured by the first camera assembly and the second camera assembly.

14. The method of claim 13, wherein the controller compares a first distance between images of the first alignment pattern and the first alignment mark photographed by the first camera assembly with a second distance between images of the second alignment pattern and the second alignment mark photographed by the second camera assembly to determine the degree to which the substrate and the patterning slit sheet are aligned with each other in the second direction perpendicular to the first direction.

15. The method of claim 13, wherein the controller compares an image of the first alignment mark captured by the first camera assembly with an image of the second alignment mark captured by the second camera assembly to determine whether or not the patterning slit sheet is tilted in the first direction.

16. The method of claim 15, wherein the controller determines a difference between locations of the captured image of the first alignment mark and the captured image of the second alignment mark in the first direction, determines that the patterning slit sheet is tilted toward the first alignment mark in the first direction when the captured image of the second alignment mark is located ahead of the captured image of the first alignment mark, and determines that the patterning slit sheet is tilted toward the second alignment mark in the first direction when the captured image of the second alignment mark is located behind the captured image of the first alignment mark.

17. The method of claim 13, wherein the controller compares an image of the first alignment pattern captured by the first camera assembly with an image of the second alignment pattern captured by the second camera assembly to determine whether or not the substrate is tilted in the first direction.

18. The method of claim 17, wherein the controller determines a difference between locations of the captured image of the first alignment mark and the captured image of the second alignment mark in the first direction, determines that the substrate is tilted toward the first alignment mark in the first direction when the captured image of the second alignment mark is located ahead of the captured image of the first alignment mark, and determines that the substrate is tilted toward the second alignment mark in the first direction when the captured image of the second alignment mark is located behind the captured image of the first alignment mark.

19. The method of claim 13, wherein the substrate and the patterning slit sheet are moved to be aligned with each other based on the degree of alignment determined by the controller.

* * * * *